(12) United States Patent
Kakuhara

(10) Patent No.: US 6,268,661 B1
(45) Date of Patent: Jul. 31, 2001

(54) SEMICONDUCTOR DEVICE AND METHOD OF ITS FABRICATION

(75) Inventor: Yumi Kakuhara, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/387,293

(22) Filed: Aug. 31, 1999

(51) Int. Cl.[7] .................................................. H01L 23/48
(52) U.S. Cl. .......................... 257/774; 257/750; 257/751; 257/758; 257/763; 257/764; 257/771; 257/775; 257/765; 257/770
(58) Field of Search ..................................... 257/750, 758, 257/774, 751, 775, 771, 763, 764, 765, 770; 438/627, 643, 653, 927

(56) References Cited

U.S. PATENT DOCUMENTS

| 5,312,775 | * | 5/1994 | Fujii et al. | 257/763 |
| 5,422,309 | | 6/1995 | Zettler et al. | 438/631 |
| 5,470,792 | | 11/1995 | Yamada | 438/463 |
| 5,621,247 | * | 4/1997 | Hirao et al. | 257/763 |
| 5,933,756 | * | 8/1999 | Fuse | 438/640 |
| 6,150,272 | * | 11/2000 | Liu et al. | 438/692 |

FOREIGN PATENT DOCUMENTS

| 6-125011 | 5/1994 | (JP) . |
| 6-330309 | 11/1994 | (JP) . |
| 8-191104 | 7/1996 | (JP) . |
| 8-274172 | 10/1996 | (JP) . |

OTHER PUBLICATIONS

Zettler, T. et al., "Self–Reconstructing Metallization A Novel Planar Process for VLSI Metallization", Jun. 8–9, 1993 VMIC Conference, pp. 359–365.

* cited by examiner

Primary Examiner—Jhihan B. Clark
(74) Attorney, Agent, or Firm—Hutchins, Wheeler & Dittmar

(57) ABSTRACT

A connection between a contact plug and an interconnect in a semiconductor device is disclosed. A contact plug is formed in a hole within an insulating film with its upper and generally in flush with a surface of the interlayer insulating film. An Interconnect uses a laminated film structure that includes an aluminum film over the upper end of each of the contact plug.

26 Claims, 17 Drawing Sheets

SEMICONDUCTOR DEVICE AND METHOD OF ITS FABRICATION

BACKGROUND OF THE INVENTION

1. Field of the Invention

The present invention relates to a semiconductor device and a method of its fabrication, and more particularly to connection for multilevel metallization.

2. Description of the Related Art

Wiring is increasingly gaining in significance for the reliability and the performance of semiconductor integrated circuits (ICs) in a current movement to miniaturization. Problems in the wiring arise due to Joule effect in conductor regions. The interaction with electromigration (EM), the wiring can be completely destroyed. In order to avoid this, particular care must be exercised to avoid high and noninform electrical resistances in a wiring process that should be suitable for dimensions in the 0.4 μm range, for example, because of the high current densities that occur therein.

Reductions of conductor line (interconnect) widths and distances, and contact hole (via) diameters are demanded to realize higher packing densities in semiconductor ICs. A contact hole (via) having a greater depth to width ratio ("aspect ratio") is also demanded. Reduction of line widths results in increase in sheet resistance of the lines. Increase in sheet resistance needs to be suppressed without increasing thickness of film forming the lines. This is because increasing the film thickness results in Increased coupling capacity (parasite capacity) between the adjacent lines. Increased coupling capacity causes a drop in high-speed operation of semiconductor ICS. The thickness of the line forming film must be set as small as possible within an allowable range for current densities required for interconnects in higher level.

For manufacturing interconnection in the 0.4 micron range, constrictions at the upper level interconnect to contact plug interface must be prevented. However, misalignment will reduce overlapping area. Specifically, there occurs exposure of portion of upper end of contact plug by the upper level interconnect due to misalignment. If a tungsten film constitutes a major part of a contact plug and an aluminum alloy film constitutes a major part of an upper level interconnect, the interconnect exhibits more susceptibility to electromigration at area where current flows into the interconnect from the contact plug. When electromigration occurs, Voids form in the aluminum alloy film within the area right above the contact plug and in the neighborhood thereof. Resistivity of the interconnect increases because charged carriers cannot pass through the voids. This degrades the reliability of the upper level interconnects. Electromigration of aluminum atom provides flow of electric charge in the same direction as flow of electric current. It increases as electric densities through upper level interconnects increase. The boundary surface between the upper level interconnect and contact plug restricts the flow rate of electric charge of the electromigration. The area at the interface of the upper level interconnect to the upper end of the contact plug is less than the area of the upper and of the contact plug due to the misalignment. This means that the electric density at the interface is always higher than the electric density at the remote portion of the interconnect from the interface. The restriction and the local increase of electric density at the interface cause increased occurrence of electromigration at the interface.

This increase may be suppressed if a spacer of conductive film is formed over the sidewalls of the upper level interconnects. But, distances among the interconnects become small, increasing the coupling (parasite) capacity, decreasing high-speed operation of the semiconductor IC.

The reduction in area at the interface of the interconnection to the contact plug causes increased resistance at the interface. Thus,, power consumption is high at the upper level interconnects within the area where the electromigration tends to occur.

An object of the present invention is to suppress occurrence of electromigration at the interface of interconnect to contact plug without any substantial increase in coupling capacity between interconnects as well as suppression of increase in power consumption.

SUMMARY OF THE INVENTION

According to one aspect of the present invention, there is provided a semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said upper flat surface portion and opening to said plurality of lower level interconnects;

a plurality of contact plugs, each filling one of said plurality of contact holes and directly connected with the associated one of said plurality of lower level interconnects at a bottom end portion thereof, each of said plurality of contact plugs including a tungsten film and a first barrier conductive film that has a predetermined thickness said bottom and portion of each of said plurality of contact plugs being in direct contact with the associated one of said plurality of lower level interconnects and formed with said first barrier conductive film; and a plurality of upper level interconnects formed on said interlayer insulating film and connected with said plurality of lower level interconnects by said plurality of contact plugs, each of said plurality of upper level interconnects including aluminum film, said aluminum film being in direct contact with and covering an upper and of the associated one of said plurality of contact plugs, each of said plurality of upper level interconnects also including aluminum alloy film formed an said upper flat surface portion of said interlayer insulating film, said aluminum alloy film being in direct contact with said aluminum film at an area right above the upper end of the associated one of said plurality of contact plugs.

According to further aspect of the present invention, there is provided a semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said upper flat surface portion and opening to said plurality of lower level interconnects;

a plurality of contact plugs, each filling one of said plurality of contact holes and directly connected with the associated one of said plurality of lower level interconnects at a bottom end portion thereof, each of said plurality of contact plugs including a tungsten film and a first barrier conductive film that has a predetermined thickness, said bottom end portion of each of said plurality of contact plugs being in direct contact with the associated one of said plurality of lower level interconnects and formed with said first barrier conductive film; and a plurality of upper level interconnects formed on said interlayer insulating film and connected with said plurality of lower level interconnects by said plurality of contact plugs, each of said plurality of upper level interconnects including an aluminum alloy film extending over said upper flat surface portion of said interlayer insulating film and an aluminum film, said aluminum film being in direct contact with and covering sides of said aluminum alloy film at areas extending right above an upper end of the associated one of said plurality of contact plugs and in the neighborhood thereof.

According to still further aspect of the present invention, there is provided a semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said flat surface portion and opening to said plurality of lower level interconnects;

a plurality of upper level interconnects formed on said interlayer insulating film and connected with said plurality of lower level interconnects via said plurality of contact holes, each of said upper level interconnects including an aluminum alloy film with a predetermined thickness;

said interlayer insulating film having a plurality of recesses, said plurality of recesses being recessed from said flat surface portion and communicating with said plurality of contact holes, respectively, each of said plurality of recesses being recessed from said flat surface portion and having an aperture occupying an area of said flat surface portion, which area is adapted to be covered by the associated one of said plurality of upper interconnects, said aperture of each of said plurality of recesses extending in a first direction, in which the associated one upper level interconnect runs, by a predetermined length and also in a second direction, which crosses said first direction, by a predetermined width, each of said plurality of recesses having a bottom spaced less from said flat surface portion than an upper surface of the associated one of said plurality of lower level interconnect;

a plurality of contact plugs, each filling one of said plurality of contact holes and one of said plurality of recesses which communicates therewith, each of said plurality of contact plugs being in direct contact with the associated one of said plurality of lower level interconnects at a bottom and portion thereof, each of said plurality of contact plugs including a tungsten film and a barrier conductive film with a predetermined thickness, said bottom end portion of each of said plurality of contact plugs being formed with said barrier conductive film, each of said plurality of contact plugs including a boundary portion in direct contact with said bottom of the associated one of said plurality of recesses, said boundary portion being formed with said barrier conductive film.

According to another aspect of the present invention, there is provided a method of fabrication of a semiconductor device, comprising the steps of:

providing a substrate having a surface;

forming a plurality of lower level interconnects over or above said surface of said substrate;

depositing an interlayer insulating film over said surface of said substrate and said plurality of lower level interconnects, said interlayer insulating film having a flat surface portion extending over said plurality of lower level interconnects;

forming a plurality of contact holes within said interlayer insulating film, each opening to one of said plurality of lower level interconnects;

forming a first barrier conductive film surface-wide;

depositing, by chemical vapor deposition, a tungsten film surface-wide;

removing, by chemical mechanical polishing, portions of said tungsten film and said first barrier conductive film from said flat surface portion of said interlayer insulating film to form contact plugs filling said contact holes, respectively;

forming an aluminum cap over each of ends of said contact plugs in a self-alignment manner;

forming an aluminum alloy film, with a first predetermined thickness, surface-wide;

forming a second barrier conductive film surface-wide; and patterning, by anisotropic etching, at least said second barrier conductive film and said aluminum alloy film to form a plurality of upper level interconnects.

According to still another aspect of the present invention, there is provided a method of fabrication of a semiconductor device, comprising the steps of:

providing a substrate having a surface;

forming a plurality of lower level interconnects over or above said surface of said substrate;

depositing an interlayer insulating film over said surface of said substrate and said plurality of lower level interconnects, said interlayer insulating film having a flat surface portion extending over said plurality of lower level interconnects;

forming a plurality of contact holes within said interlayer insulating film, each opening to one of said plurality of lower level interconnects;

forming, by sputtering, a first barrier conductive film surface-wide;

depositing, by chemical vapor deposition, a tungsten film surface-wide;

removing, by chemical mechanical polishing, portions of said tungsten film and said first barrier conductive film from said flat surface portion of said interlayer insulating film to form contact plugs filling said contact holes, respectively;

forming a second barrier conductive film, having a first predetermined thickness, surface-wide:

forming an aluminum alloy film, having a second predetermined thickness, surface-wide;

forming a third barrier conductive film, having a third predetermined thickness, surface-wide:

forming an insulating film surface-wide;

patterning, by anisotropic etching, said insulating film;

patterning, by anisotropic etching, said third barrier conductive film, said aluminum alloy film and said second barrier conductive film to form a patterned laminated structure; and placing a photoresist formed with an opening right above at least one of the ends of said contact plugs and in the neighborhood thereof;

forming, by chemical vapor deposition using said photoresist as a mask, aluminum film over sides of said patterned laminated structure to form a plurality of upper level interconnects.

According to yet another aspect of the present invention, there is provided a method of fabrication of a semiconductor device, comprising the steps of:

providing a semiconductor substrate having a surface;

forming a plurality of lower level interconnects over or above said surface of said substrate;

depositing an interlayer insulating film of silicon oxide over said surface of said substrate and said plurality of lower level interconnects, said interlayer insulating film having a flat surface portion extending over said plurality of lower level interconnects;

forming a silicon nitride film over said interlayer insulating film;

forming a plurality of contact holes within said interlayer insulating film, each opening to one of said plurality of lower level interconnects;

forming, by sputtering, a first titanium nitride film surface-wide;

depositing, by chemical vapor deposition, a tungsten film surface-wide;

removing, by chemical mechanical polishing, portions of said tungsten film and said first titanium nitride film from said flat surface portion of said interlayer insulating film to form contact plugs filling said contact holes, respectively;

forming a second titanium nitride film, having a first predetermined thickness, surface wide;

forming, by sputtering, an aluminum alloy film, having a second predetermined thickness, surface-wide;

forming a titanium tungsten film, having a third predetermined thickness, surface-wide;

forming a first silicon oxide film surface-wide;

patterning, by anisotropic etching, said first silicon oxide film and said titanium tungsten film to form silicon oxide caps and then patterning, by anisotropic etching, said aluminum alloy film and said second titanium nitride film to form a plurality of laminated structures;

forming a second silicon oxide film surface-wide;

etching back said second silicon oxide film to form a silicon oxide spacer over side surfaces of each of said laminated structures;

placing a photoresist formed with an opening right above at least one of the ends of said contact plugs and in the neighborhood thereof;

removing, by etching using said photoresist as a mask and buffer hydrofluoric acid as echant, portions of said silicon oxide caps, said silicon oxide spacers, and said titanium tungsten film; and forming, by chemical vapor deposition using said photoresist as a mask, aluminum film over exposed sides of said laminated structure and exposed portion of said upper ends of said plurality of contact plugs to form a plurality of upper level interconnects.

According to still yet further aspect of the present invention, there is provided a method of fabrication of a semiconductor device, comprising the steps of:

providing a substrate having a surface;

forming a plurality of lower level interconnects over or above said surface of said substrate;

depositing an interlayer insulating film over said surface of said substrate and said plurality of lower level interconnects, said interlayer insulating film having a flat surface portion extending over said plurality of lower level interconnects;

forming a plurality of recesses inward from said flat surface portion of said interlayer insulating film, each of said plurality of recesses being recessed from said flat surface portion and having an aperture occupying an area of said flat surface portion, which area is adapted to be covered by the associated one of a plurality of upper interconnects to be formed on said flat surface portion of said interlayer insulating film, said aperture of each of said plurality of recesses extending in a first direction, in which the associated one upper level interconnect runs, by a predetermined length and also in a second direction, which crosses said first direction, by a predetermined width, each of said plurality of recesses having a bottom spaced less from said flat surface portion than an upper surface of the associated one of said plurality of lower level interconnects;

forming a plurality of contact holes through said interlayer insulating film, each extending through the bottom of the associated one of said plurality of recesses and opening to one of said plurality of lower level interconnects;

forming, by sputtering, a first barrier conductive film surface-wide;

depositing, by chemical vapor deposition, a tungsten film surface-wide;

removing, by chemical mechanical polishing, portions of said tungsten film and said first barrier conductive film from said flat surface portion of said interlayer insulating film to form contact plugs, each filling one of said contact holes and the associated one of said plurality of recesses;

forming a second barrier conductive film, having a first predetermined thickness, surface-wide;

forming, by sputtering, an aluminum alloy film, having a second predetermined thickness, surface-wide;

forming a third barrier conductive film, having a third predetermined thickness, surface wide; and patterning, by anisotropic etching, said second third barrier conductive film, said aluminum alloy film, and said second barrier conductive film to form a plurality of upper level interconnects.

DESCRIPTION OF THE PREFERRED EMBODIMENT

It should be understood that the drawings are not necessarily to scale, In the following description, preferred implementations according to the present invention are described along with various embodiments of a semiconductor device. According to each of the embodiments, a semiconductor device incorporates multiple wiring layers fabricated according to a 0.4 microns ($\mu$m) design rule and processing technique wherein the minimum processing dimension is 0.4 and alignment margin is 0.05 $\mu$m. The width of each distance between the adjacent two interconnects, and diameter of each contact hole are referred to based on ideal values, namely, design target values, that have been determined after neglecting fluctuations and/or variations due to etching. It should be understood that the invention is not limited to these values. Throughout all views of the drawings, oblique lines shadow semiconductor substrates and conductive portions or films only to distinguish them from portions or films of dielectric or insulating material.

Figure 1A:
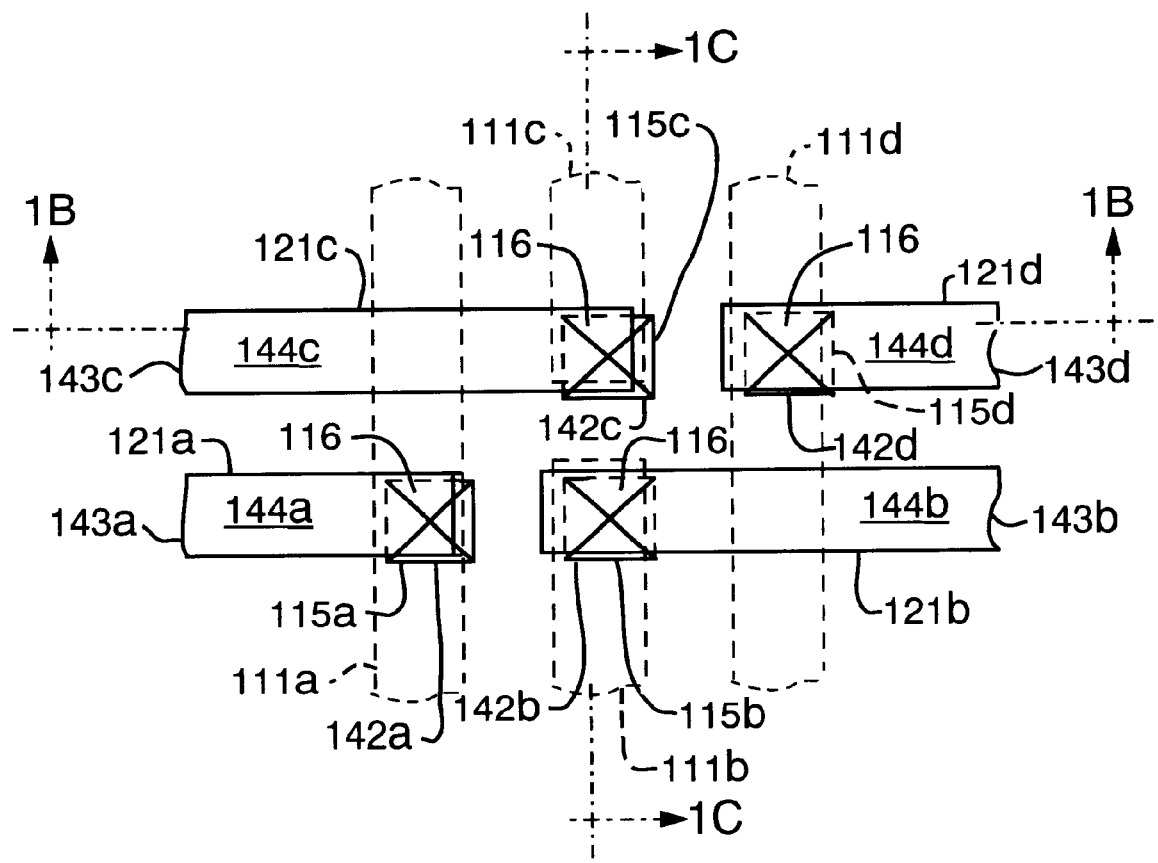
FIG. 1A is a plan view of a first, preferred implementation of a semiconductor device according to the invention.
Figure 1B:
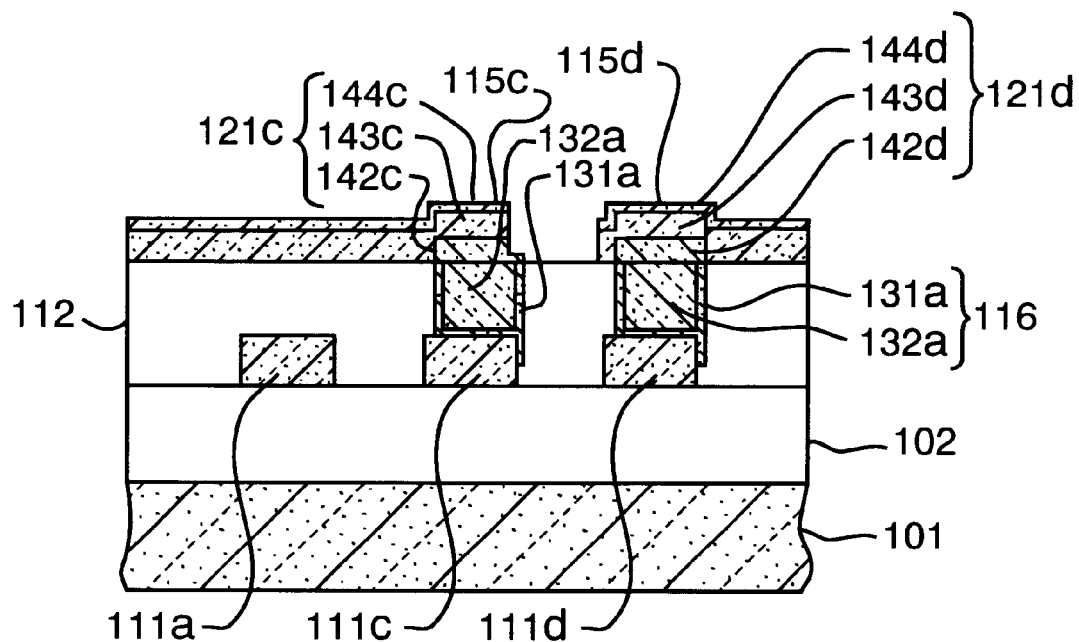
FIG. 1B is a cross sectional view taken through the line A—A in FIG. 1A.
Figure 1C:
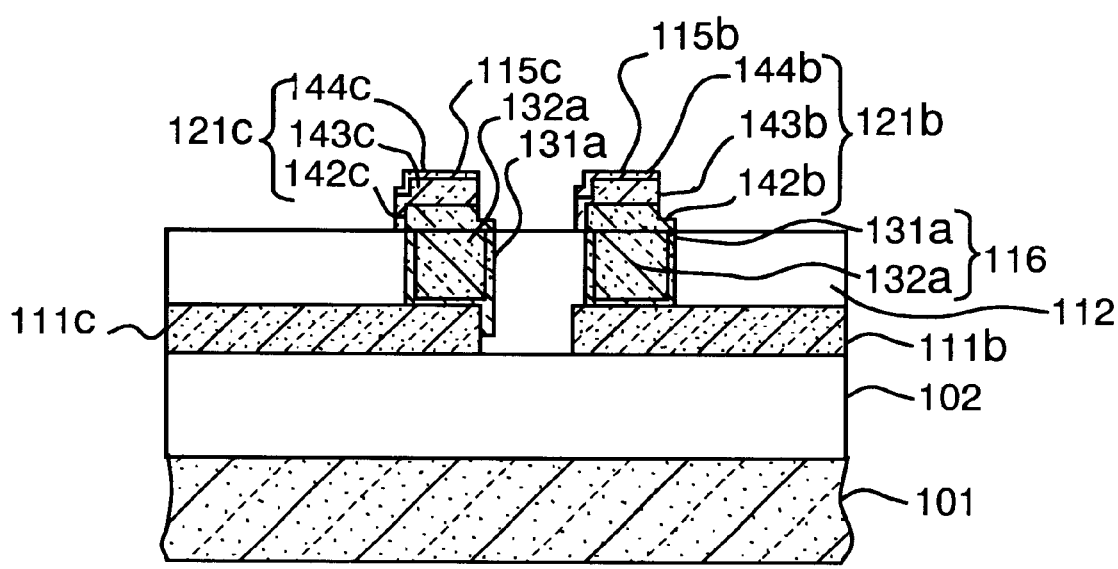
FIG. 1C is a cross sectional view taken through the line B—B in FIG. 1A.

FIGS. 1A–1C, 2A–2C and 3A–3B illustrate a first preferred implementation of the invention, Referring to FIGS. 1A–1C, a semiconductor device includes a silicon substrate 101. An insulating film 102 is deposited over the surface of the substrate 101. The insulating film 102 may be formed of a field oxidation film of the LOCOS type. The field oxidation film is approximately 0.4 $\mu$m thick. The surface of the insulating film 102 may not be completely flat. A conductive level or layer, which includes interconnects 111a, 111b, 111e and 111d, is formed on the surface of the insulating film 102. In this example, the interconnects are of the same height. The conductive layer is not limited to this example, The conductive layer may include diffusion regions on the surface of the substrate 101. The diffusion regions constitute semiconductor elements. The interconnects each are 0.4 $\mu$m width at the minimum. The distance between the adjacent two interconnects is 0.4 $\mu$m at the minimum. The line pitch is 0.8 $\mu$m at the minimum. The conductive layer or level 111a, 111b, 111c and 111d excluding the diffusion regions is 0.4 $\mu$m thick at the minimum. When an aluminum alloy film forms a major part of the conductive layer 111a, 111b, 111c and 111d, a barrier conductive film covers the upper surface of each of the interconnects. The barrier conductive film may be formed of titanium nitride.

An interlayer insulating film 112 of silicon dioxide extends over the surface of the structure to cover the exposed surface portions of the dielectric film 102 and the interconnects 111a, 111b, 111c and 111d. The interlayer insulating film 112 has a flat surface. The interlayer insulating film 112 is 1.0 $\mu$m thick at portions right above all of the interconnects 111a, 111b, 111c and 111d. The interlayer insulating film 112 is formed with vias or contact holes 115a, 115b, 115c and 115d at selected locations above the interconnects 111a, 111b, 111c and 111d. In this example, the shape of each of the contact holes 115a, 115b, 115c and 115d is square of 0.4 $\mu$m in width. The shape of each contact hole is not limited to this example and can be round, oval and etc. The distance between adjacent two of the contact holes is 0.4 $\mu$m, providing 0.8 $\mu$m as the minimum pitch. The contact holes 115a, 115b, 115c and 115d expose mainly the upper surfaces of interconnects 111a, 111b, 111c and 111d, respectively. But, the contact holes 115a, 115b, 115c and 115d expose portions of the side surfaces of the interconnects 111a, 111b, 111c and 111d. This is because there exits difference in height between the upper surfaces of the interconnects 111a, 111b, 111c and 111d and there occurs a deviation in mask alignment for photolithography used for forming the contact holes. Each contact hole, see the contact hole 115a for example, defines a clearance adjacent the edge of the upper surface of each interconnect, see the interconnect 111a for example. The width of such clearances does not exceed the alignment margin and amounts to at most 0.05 $\mu$m (50 nm).

Contact plugs 116 fill in all of the contact holes 115a, 115b, 115c and 115d, respectively. The upper end of each contact plug 116 is generally in flush with the upper surface of the interlayer insulating film 112. A first barrier conductive film in the form of, for example, a titanium nitride film 131a, is deposited and then a tungsten film 132a is deposited to the titanium nitride film 131a, making the contact plugs 116. The first barrier conductive film is not limited to the titanium nitride film. It may be in the form of a titanium tungsten film. When the conductive layer includes diffusion regions, the first barrier conductive film may be a composite film including a titanium film and a titanium nitride film deposited to the titanium film. Preferably, the thickness of the titanium nitride film 131a is at least in the neighborhood of 50 nm to let it act as the barrier conductive film. The titanium nitride film 131a covers the bottom and side surface of each contact hole and thinned there. The other portion of the film 131a is several times as thick as the thinned portion deposited to the side surface of each contact hole.

At upper ends, the contact plugs 116 are in direct contact with aluminum films 142a, 142b, 142c and 142d, which cover the contact holes 115a, 115b, 115c and 115d, respectively. Each of the aluminum films 142a, 142b, 142c and 142d is about 0.2 microns thick. Aluminum alloy films 143a, 143b, 143c and 143d are in direct contact with and partially cover the upper surface of interlayer insulating film 112. Each of the aluminum alloy films 143a, 143b, 143c and 143d is about 0.4 μm thick. The aluminum alloy films 143a, 143b, 143c and 143d are in direct contact with the aluminum films 142a, 142b, 142c and 142d, respectively, at portions right above the upper end portions of the contact holes 115a, 115b, 115c and 115d, respectively. Each of the aluminum alloy films 143a, 143b, 143c and 143d is 0.4 μm thick. The minimum distance between the adjacent two of the aluminum alloy films 143a, 143b, 143c and 143d is 0.4 μm. The minimum pitch is 0.8 microns. The aluminum alloy films 143a, 143b, 143c and 143d contain 0.5-wt. % copper (Cu). Second barrier conductive films 144a, 144b, 144c and 144d are in direct contact with and cover the upper surfaces of the aluminum alloy films 143a, 143b, 143c and 143d, respectively. In this example, the second barrier conductive films 144a, 144b, 144c and 144d are made of titanium nitride film having a thickness falling in a range from 25 manometers to 50 manometers. The material of the second barrier conductive films 144a, 144b, 144c and 144d is not limited to the titanium nitride film. The second barrier conductive films 144a, 144b, 144c and 144d may be made of titanium tungsten film. The titanium nitride films 144a, 144b, 144c and 144d function to prevent stress migration (SM) of the upper level and serve as anti-reflection films. The latter function provides merit upon fabrication.

A interconnect 121a of an upper level is connected by the contact hole 115a with the interconnect 111a of the lower level. It includes an aluminum film 142a, an aluminum alloy film 143a and a titanium nitride film 144a. A interconnect 121b of the upper level interconnect 121b is connected by the contact hole 115b with the interconnect 111b of the lower level. It includes an aluminum film 142b, an aluminum alloy film 143b and a titanium nitride film 144b. A interconnect 121c of the upper level is connected by a contact hole 115c with the interconnect 111c of the lower level. It includes an aluminum film 142c, an aluminum alloy film 143c and a titanium nitride film 144c. A interconnect 121d of the upper level is connected by the contact hole 115d with the interconnect 111d of the lower level. It includes an aluminum film 142d, an aluminum alloy film 143d and a titanium nitride film 144d.

In the example described above, the provision of aluminum films 142a, 142b, 142c and 142d is essential. Without the provision of such aluminum films, the task would not be accomplished. With regard to, for example, the contact hole 115a, the aluminum film 142a of the interconnect 121a completely covers the upper end of the contact plug 116. This ensures a sufficiently wide contact area of $(0.4\ \mu m)^2$ through which the upper level interconnect 121a is connected with the contact plug 116, suppressing an increase in contact resistance between the interconnect of the upper level and the contact plug. Thus, a local increase in electric current density is suppressed at a portion immediately above or in the neighborhood of the contact hole, preventing occurrence of electric migration (EM). The distance between the adjacent two spaced interconnects may become narrower than 0.4 μm and the thickness of aluminum or aluminum alloy film may become thick within confined areas immediately above the contact holes (or contact plugs) and not over the whole length of each of the interconnects. This arrangement can suppress an increase in coupling capacity between the upper level interconnects.

Let us consider a less preferred structure. In this structure, an aluminum alloy film 143a covers the surface of the interlayer insulating film 112 via another barrier conductive film. Via this barrier conductive film, it is connected with the aluminum film 142a at the upper end of the contact hole 115a (or the contact plug 116). This structure is not preferred because the aluminum film 142a can be regarded as a part of the upper and of the contact plug 116. In this case, the area through which this another barrier conductive film contacts with the aluminum film 142a becomes less than $(0.4\ \mu m)^2$, making it difficult to avoid an increase in resistance and thus an increase in electric current density.

FIGS. 2A–2C and FIGS. 3A & 3B illustrate fabrication processes of the structure as shown in FIGS. 1A to 1C.

Figure 2A:
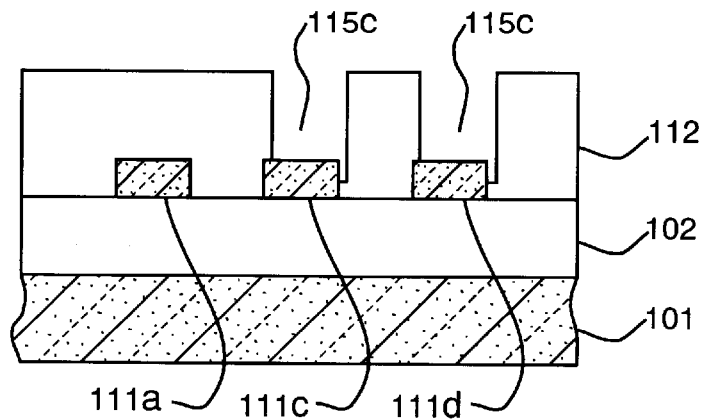
FIGS. 2A to 2C are cross sectional views taken through the line A—A in FIG. 1A, illustrating fabrication steps.

Referring to FIG. 2A, a field oxidation film of the LOCOS type extends over the surface of a silicon substrate 101 to form an insulating film 102 of 0.4 μm thick. Interconnects 111a, 111b, 111c and 111d of a lower level are formed on the silicon substrate 101 or the insulating film 102 on the silicon substrate 101. The interconnects of the lower level excluding diffusion regions, if any, are 0.4 μm thick. Silicon dioxide is formed over the entire surface of the assembly. The silicon dioxide is polished by chemical mechanical polishing (CMP) technique to provide a flat upper surface, thus providing an interlayer insulating film 112. A difference between the upper surface and the interlayer insulating film 112 and the upper and the upper surface of the interconnects 111a, for example, of the lower level amounts to around 1.0 microns. With photolithography using anisotropic etching, vias or contact holes 115a, 115b, 115c and 115d are etched through the interlayer insulating film 112. The contact holes 115a, 115b, 115c and 115d are 0.4 μm in diameter and extend to the interconnects 111a, 111b, 111c and 111d of the lower level, respectively. Referring to FIG. 2A, without any difficulty, the contact holes 115a, 115b, 115c and 115d can be prevented from extending down to a level where the lower surfaces of the interconnects 111a, 111b, 111c and 111d of the lower level are lying. Let us consider the case where the lower level includes portions, such as diffusion regions formed on the silicon substrate 102, which are different in height from that of the interconnects 111a, 111b, 111c and 111d by at least 0.4 μm. In this case, another photolithography is preferably required to etch contact holes opening to the diffusion regions, respectively.

Figure 2B:
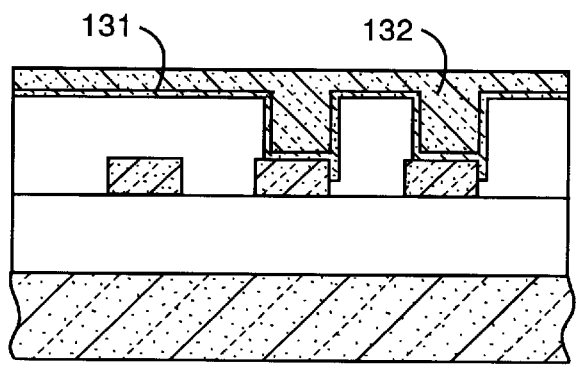
Figure 2C:
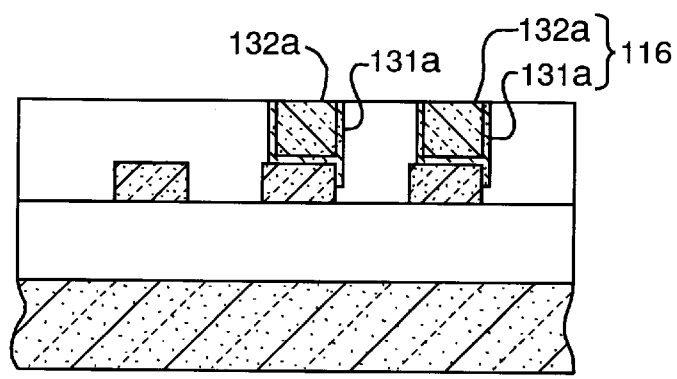

Referring to FIG. 2B, sputtering technique is used to deposit titanium nitride to the entire surface of the assembly to form a titanium nitride film 131. The titanium nitride film 131 covers the exposed top surfaces of the interconnects 111a, 111b, 111c and 111d to work as a barrier conductive film. To act as a barrier conductive film, the titanium nitride film 131 should be about 50 nanometers thick at the exposed portions on the top surfaces of the interconnects 111a, for example, of the lower level by the contact holes 115a, for example. If the employed sputtering is conducted by ordinary sputtering system, the titanium nitride film formed on the exposed side surfaces of the interconnects 111a, 111b, 111c and 111d is around 10 nanometers thick. With magnetron sputtering system having a particle collimate filter, the titanium nitride film formed on the exposed side surface is around 5 nanometer thick. If the lower level includes diffusion regions, it is preferred to deposit titanium film under the titanium nitride film 131. Subsequently a tungsten film 132 of around 400 to 500 nanometers thick is deposited over the whole surface by a blanket chemical vapor deposition (CVD) where tungsten hexafluoride (WF$_6$) gas is introduced into the deposition chamber as a source gas. Additionally hydrogen (H$_2$) gas and then silane (SiH$_4$) gas are introduced into the deposition chamber. The tungsten film 132 deposited in this manner exhibits superiority in filling in the contact holes 115a, 115b, 115c and 115d. Referring to FIG. 2B, if the titanium nitride film 131 fails to cover portions on the side surfaces of the interconnects 111a, 111b, 111c and 111d of the lower level, the tungsten film 132 can completely cover such portions. Selective growing technique is not preferred as compared to the blanket CVD in forming a tungsten film because the depth of the contact holes are not the same.

Growth of aluminum film 142 by selective low-pressure chemical vapor deposition (LPCVD) may use, as source gas, trimethylaluminium (Al(CH$_3$)$_3$) or dimethylaluminium hydride (Al H(CH$_3$)$_2$) or triisobuthylaluminium (Al(CH$_2$ CH(CH$_3$)$_2$)$_3$). Hydrogen (H$_2$) or nitrogen (N$_2$) may be used as carrier gas. Triisobuthylaluminium (Al(CH$_2$ CH(CH$_3$)$_2$)$_3$) vaporizes at 20° C. under pressures around 25 Pa. Dimethylaluminium hydride (Al H(CH$_3$)$_2$) vaporizes at 20° C. under pressures around 270 Pa. Triisobuthylaluminium is introduced as source gas into furnace at 250° C. under pressures around 130 Pa to perform aluminum film deposition by LPCVD. Dimethylaluminium hydride is introduced as source gas into furnace at 100° C. to 250° C. under pressures around 130 Pa to perform aluminum film deposition by LPCVD.

Figure 3A:
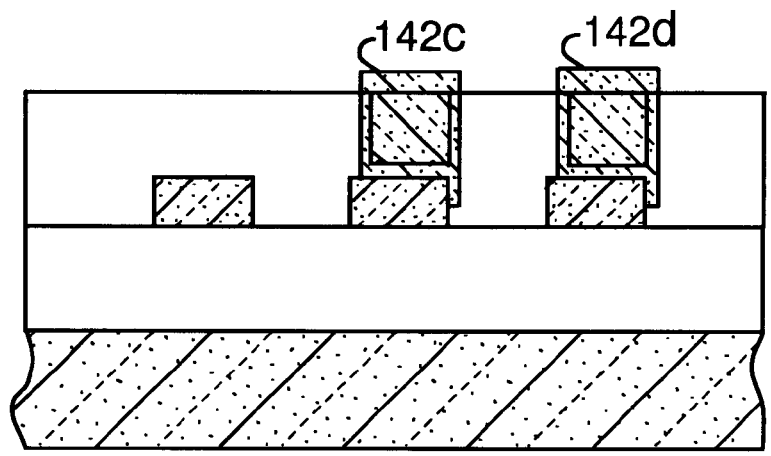
FIGS. 3A and 3B are cross sectional views taken through the line A—A in FIG. 1A, illustrating fabrication steps.
Figure 3B:
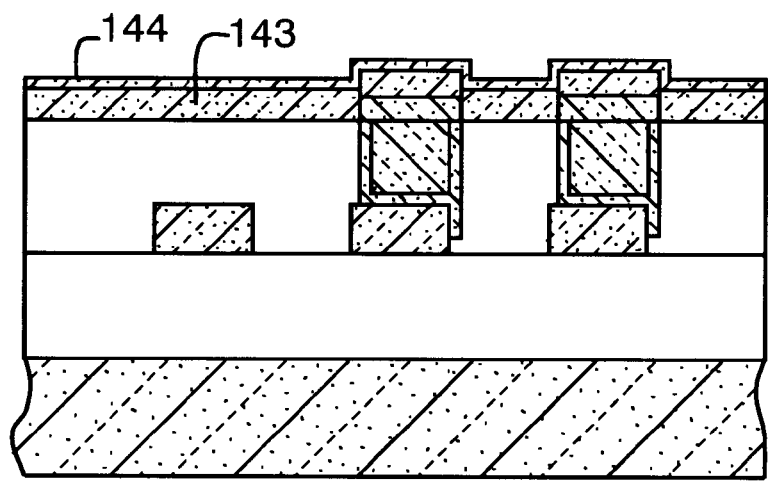

Referring to FIG. 3B, with the assembly kept at temperature 150° C. to 250° C., aluminum alloy film 143 of aluminum-copper alloy is deposited by sputtering to a thickness of 400 nanometers over the entire surface of the assembly. The deposition of aluminum alloy film 143 by high temperature sputtering is not preferred for reason described later. Subsequently, titanium nitride film 144 is deposited to a thickness of 25 nanometers to 50 nanometers by sputtering.

Anisotropic dry etching is used to etch the titanium nitride film 144 and aluminum alloy film 143. A mixture gas of Boron chloride (BCl$_3$) and chloride (Cl$_2$) is used as etching gas an photoresist film is used as a mask. Etching of the aluminum film should be suppressed to leave aluminum film portions 142a, 142b, 142c and 142d capping completely the upper ends of the contact plugs 116. As a result of this anisotropic dry etching, the aluminum alloy film portions 143a, 143b, 143c and 143 are left in direct contact with the aluminum film portions 142a, 142b, 142c, and 142d, respectively, and the titanium nitride film portions 144a, 144b, 144c, and 144d are left in direct contact with the aluminum alloy film portions 143a, 143b, 143c and 143d, respectively. After the photoresist film has been removed, the assembly is subject to thermal treatment at around 450° C. to combine the aluminum alloy film portions 143a, 143b, 143c and 143d with the aluminum film portions 142a, 142b, 142c and 143d, respectively, to form an alloy. In the process of this heat treatment, the boundary between each of the aluminum alloy film portions with the adjacent aluminum film portion disappears.

Increased degree of precise control of speed of etching is needed in the above-mentioned anisotropic etching. At least, it is preferred to lower the etching speed in the neighborhood of the boundary between the aluminum alloy film 143 and the aluminum film portions 142a, 142b, 142c and 142d. In this example, a power of 800 W was supplied to a processing chamber and pressure was 1.3 Pa. Boron chloride (BCl$_3$) and chloride (Cl$_2$) were introduced into the chamber at 3 SCCM and 6 SCCM, respectively. In this case, aluminum containing film was etched at very low speed of around 50 nm/min. A detector is needed to detect end point of etching where the above-mentioned boundary is. In this case, the aluminum alloy film 143 contains copper. An emission spectrometer was used, as such a detector, to analyze the distribution of copper chloride (CuCl$_2$) or a secondary ion mass spectrometer (SIMS) was used to analyze the distribution of copper (Cu) thereby to detect end point of etching the aluminum alloy film 143. If the end point of etching is to be detected by the SIMS, the above-mentioned low etching speed is preferred because there is a considerable response delay in the SIMS.

If the upper surfaces of aluminum film portions 142a, 142b, 142c and 142d were not flat, detection of the above-mentioned boundary would be difficult. Further, high temperature sputtering were used for formation of aluminum alloy film 143, it would become difficult to suppress etching of the underlying aluminum film portions 142a, 142b, 142c and 142d in the anisotropic etching utilizing the above-mentioned detection of stop point of etching. This is because, in the process of formation of aluminum alloy film with high temperature sputtering, copper is diffuse into the underlying aluminum film portions 142a, 142b, 142c and 142d, making it difficult to detect the boundary between them.

According to the first preferred implementation, selective growing technique has been used to form the aluminum film. The selectively grown aluminum film is essential the first preferred implementation.

Referring to FIGS. 4A–4C, 5A–5B, 6A–6B, 7A–7C and 8A–8B, the second preferred implementation of the present invention is described. As will be understood from the following description, an upper level is formed of patterned laminated conductive films that include an aluminum alloy film and also of an aluminum film that directly coats or covers a contact plug at a portion immediately above an upper end of the contact plug and at least side wall of the patterned laminated conductive films immediately above the upper end of the contact plug.

The second preferred implementation is described along with a first embodiment illustrated in FIGS. 4A–4C, 5A–5B, and 6A–6B, and also with a second embodiment illustrated in FIGS. 7A–7C, and 8A–8B.

Figure 4A:
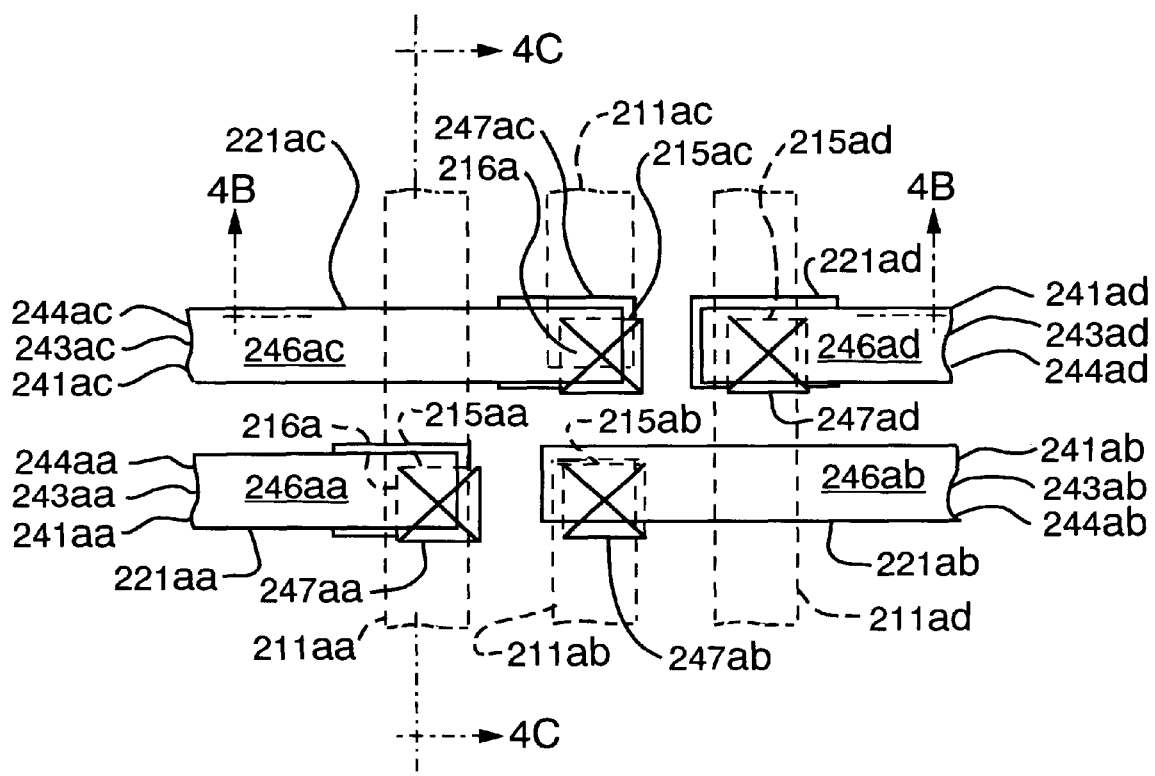
FIG. 4A is a plan view of a first embodiment of a second preferred implementation of a semiconductor device according to the invention.
Figure 4B:
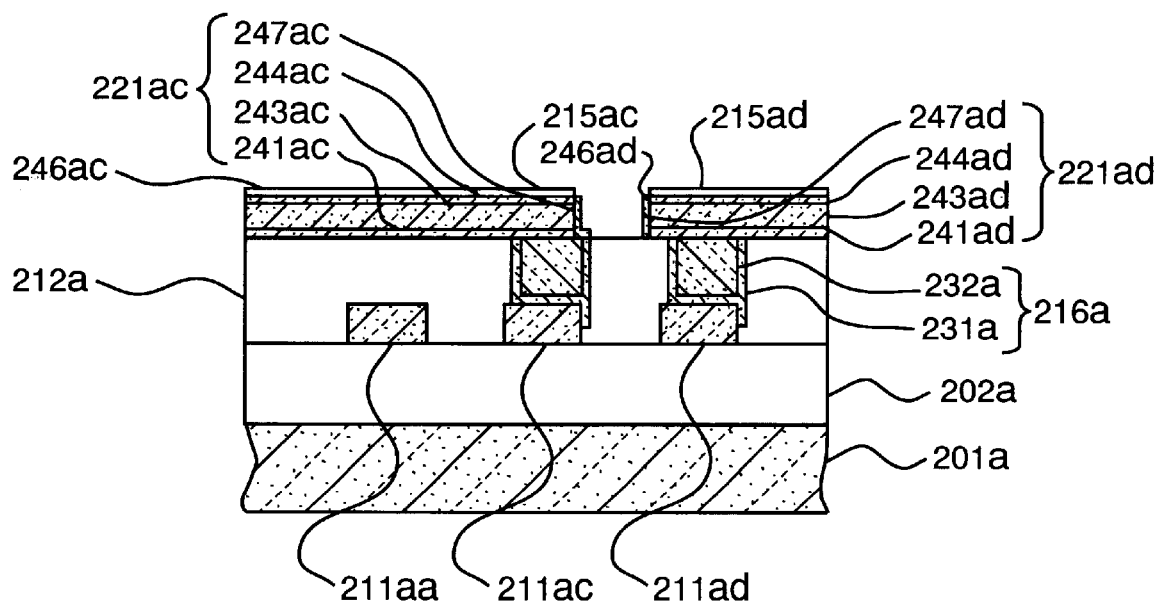
FIG. 4B is a cross sectional view taken through the line A—A in FIG. 4A.
Figure 4C:
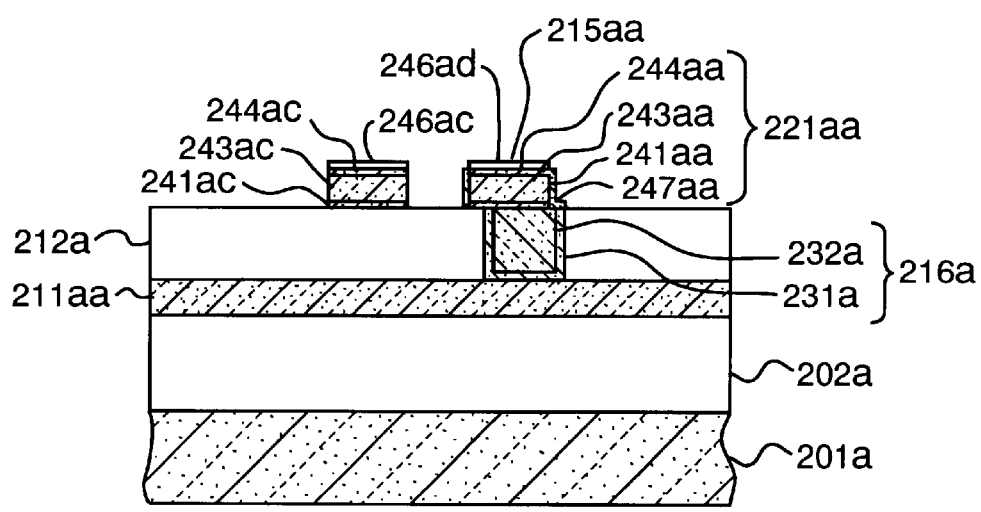
FIG. 4C is a cross sectional view taken through the line B—B in FIG. 4A.

Referring to FIGS. 4A–4C, a semiconductor device includes a silicon substrate 201a and an insulating film 202a deposited on the surface of the substrate 201a. A lower level, which includes interconnects 211aa, 211ac and 211ad, is formed over the surface of the silicon substrate 201a via the insulating film 202a. The insulating film 202a may be formed of a field oxidation film of the LOCOS type. The field oxidation film is around 0.4 μm thick. The surface of the insulating film 202 may not necessarily be completely flat. The lower level is not limited to this example and may include a diffusion region, which constitutes a semiconductor element, on the surface of the silicon substrate 201a. The minimum width of each of the interconnects 211aa, 211ab, 211ac and 211ad is 0.4 μm, the minimum line pitch is 0.8 μm. The film thickness of the interconnects if the lower level does not include the diffusion region is around 0.4 μm.

An interlayer insulating film 212a of silicon dioxide coats the surface of the insulating film 202a and the interconnects 211aa, 211ab, 211ac and 211ad. The surface of the interlayer insulating film 212a is flat. For example, the thickness of the interlayer insulating film over the interconnect 211aa is 1.0 im. The interlayer insulating film 202a is provided with contact holes 215aa, 215ab, 215ac, and 215ad over areas of the interconnects 211aa, 211ab211ac and 211ad where contacts are to be formed. The contact holes 215aa, 215ab, 215ac and 215ad are formed in the interlayer insulating film 202a down to the interconnects 211aa, 211ab, 211ac and 211ad, respectively. The diameter of each of the contact holes is 0.4 μm. The distance between the nearest two contact holes is 0.4 μm. The minimum layout pitch of the contact holes amounts to 0.8 im. The width of clearance that is defined by side wall of the interconnect 211aa, for example, and side wall of the contact hole 214aa, is less than the alignment margin and amounts at most to 0.5 im or 50 nanometers (nm).

Contact plugs 216a fill in the contact holes 215aa, 215ab, 215ac and 215ad, respectively. The upper ends of the contact plugs 216a are generally in flush with the surface of the interlayer insulating film 212a. Each of the contact plugs 216a is a laminated structure of a first barrier conductive film, which is in the form of a titanium nitride film 231a, and a tungsten film 232a. The first barrier conductive film is not limited to the titanium nitride film and may be a titanium tungsten film. If the lower level involves diffusion region, the first barrier conductive film may be composed of a laminated structure of a titanium film and a titanium nitride film. The thickness of the titanium nitride film 231a over the top of each of the interconnects 211aa, 211ab, 211ac and 211ad is preferably at least around 50 nm so that it can work as a barrier conductive film. The thickness of the titanium nitride film 231a at a portion directly coating the side of each of the contact holes 215aa, 215ab, 215ac and 215ad is at most one several of the thickness of the titanium nitride film at a portion extending over the top of each of the interconnects 211aa, 211ab, 211ac and 211ad.

Titanium nitride film portions 241aa, 241ab, 241ac and 241ad, each of which is around 50 nm thick and works as a second barrier conductive film, are in direct contact with the upper ends of the contact plugs 216a within the contact holes 215aa, 215ab, 215ac and 215ad. Each of the titanium nitride film portions 241aa, 241ab, 241ac and 241ad has extension directly coating the surface of the interlayer insulation film 212a. The minimum width of each of the titanium nitride film portions 241aa, 241ab, 241ac and 241ad is 0.4 im. The minimum distance between the adjacent two of the titanium nitride film portions 241aa, 241ab, 241ac and 241ad is 0.4 im. The second barrier conductive film is not limited to the titanium nitride and may be a titanium film or a laminated structure of a titanium film and a titanium nitride film or a titanium tungsten film. Aluminum alloy film portions 243aa, 423ab, 243ac and 243ad directly coat the upper surfaces of the titanium nitride film portions 241aa, 241ab, 241ac and 241ad, respectively. The aluminum alloy film portions 243aa, 243ab, 243ac and 243ad, each of which is 0.4 im thick and contains 0.5 wt % of copper, are of the same profile with the titanium nitride film portions 241aa, 241ab, 241ac and 241ad, respectively. Titanium nitride film portions 244aa, 244ab, 244ac and 244ad, each of which is a third barrier conductive film and 25 nm to 50 nm thick, directly coat the upper surfaces of the aluminum alloy film portions 243aa, 243ab, 243ac and 243ad, respectively. The third barrier conductive film is not limited to the titanium nitride and may be a titanium tungsten film. Silicon oxide film caps 246aa, 246ab, 246ac and 246ad directly coat the upper surfaces of the titanium nitride film portions 244aa, 244ab, 244ac and 244ad, respectively. Each of the titanium nitride film portions 241aa, 241ab, 241ac and 241ad, the adjacent one of the aluminum alloy film portions 243aa, 243ab243ac and 243ad, and the adjacent one of the titanium film portions 244aa, 244ab, 244ac and 244ad form a patterned laminated conductive film portion. Each patterned laminated film portion does not necessarily coat completely the upper end of the underlying contact plug 216a. This derives from an alignment error in photolithography. The maximum width (alignment margin) of the exposed portion of each of the contact plugs 216a uncovered by the laminated conductive film portion is around 50 nm.

At a location immediately above the upper end of each of the contact plugs 216a and in the neighborhood, 0.2 μm of the location, an aluminum film portion 247aa or 247ab or 247ac or 247ad directly coats side surfaces of the overlying laminated conductive film portion. The aluminum film portion 247aa also coats the exposed portion of the upper end of the contact plug 216adirectly and completely. Each of the aluminum film portions coating the side surfaces is 50 nm to 100 nm thick.

It should be noted that the titanium nitride film portion 241aa, aluminum alloy film portion 243aa, titanium nitride film portion 244aa, and aluminum film portion 247aa constitute an upper lever 221aa that is connected via the contact hole 215aa to the lower level 211aa. Further, the titanium nitride film portion 241ab, aluminum alloy film portion 243ab, titanium nitride film portion 244ab, and aluminum film portion 247ab constitute an upper level interconnect 221ab that is connected via the contact hole 215ab to the lower level interconnect 211ab. Still further, the titanium nitride film portion 241ac, aluminum alloy film portion 243ac, titanium nitride film portion 244ac, and aluminum film portion 247ac constitute an upper level 221ac that is connected via the contact hole 215ac to the lower level 211ac. Lastly, the titanium nitride film portion 241ad, aluminum alloy film portion 243ad, titanium nitride film portion 244ad, and aluminum film portion 247ad constitute an upper level 221ad that is connected via the contact hole 215ad to the lower level 211ad.

In the example shown in FIGS. 4A–4C, the provision of the aluminum film portions 247aa, 247ab, 247ac and 247ad is essential. Without the provision of such aluminum films, the task would not be accomplished. With regard to, for example, the contact hole 215aa, the titanium nitride film portion 241aa and aluminum film portions 247aa completely cover the upper end of the contact plug 216a. This ensures a sufficiently wide contact area of (0.4 im )$^2$ through which the upper interconnect 221a is connected with the contact plug 216a, suppressing an increase in contact resistance between the interconnects of the upper level and the contact plug. Thus, a local increase in electric current density is suppressed at a portion immediately above or in the neighborhood of the contact hole, preventing occurrence of electric migration (EM). The provision of aluminum film portions 247aa, 247ab, 247ac and 247ad causes the distance between the adjacent two spaced interconnects to become narrower than 0.4 im within confined areas immediately above the contact holes (or contact plugs) and in the neighborhoods thereof. Thus the reduction in the distance between the adjacent two interconnects does not extend over the whole length of such interconnects. This arrangement can suppress an increase in coupling capacity between the interconnects of the upper level.

According to this example shown in FIGS. 4A to 4C, the film thickness of each interconnect of the upper level is greater than that of each interconnect of the upper level of the example shown in FIGS. 1A to 3B. However, this increase in the film thickness will not induce any appreciable increase in coupling capacity due to that fact that, in both of the examples, the aluminum alloy film of the upper level only works as electric current path. This is because the resistivity of the titanium nitride is far greater than the resistivity of aluminum (or aluminum alloy). According to each interconnect of the upper level shown in FIGS. 4A to 4C, the aluminum alloy film is interposed between the upper and lower titanium nitride films, thus exhibiting far more resist to electric migration (EM) than the interconnects of the upper level of the example shown in FIGS. 1A to 3B. Comparing the structure of each interconnect of the upper level of the example shown in FIGS. 4A to 4C with its counterpart of the example shown in FIGS. 1A to 3B reveals that the former is advantageous than the latter in case where a void is formed through the aluminum or its alloy due to EM within an area above an in the neighborhood of a contact hole.

FIGS. 5A & 5B and FIGS. 6A & 6B illustrate fabrication processes of the structure as shown in FIGS. 4A to 4C.

Figure 5A:
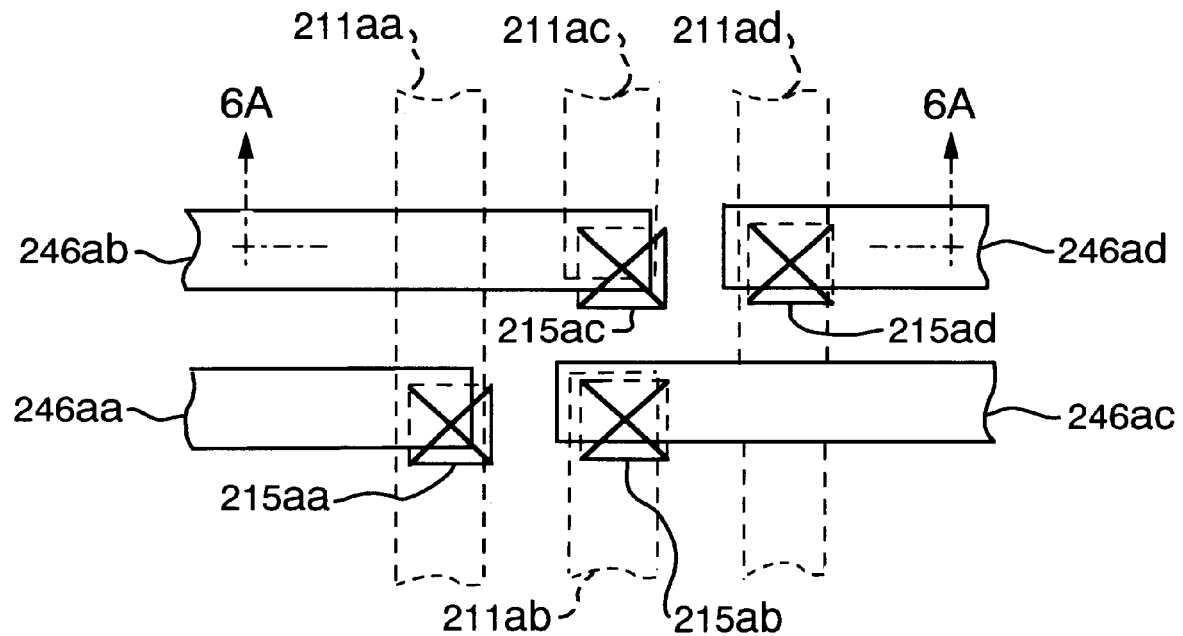
FIGS. 5A and 5B are cross sectional views illustrating fabrication steps of the semiconductor device shown in FIGS. 4A to 4C.
Figure 5B:
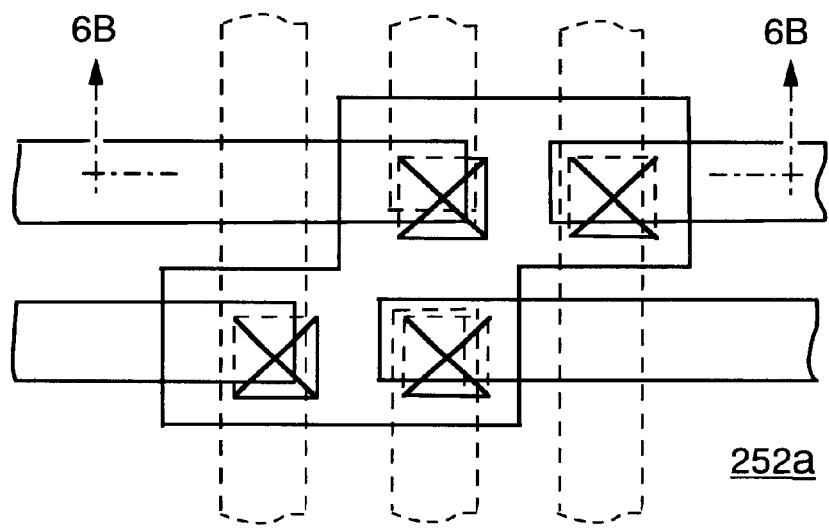
Figure 6A:
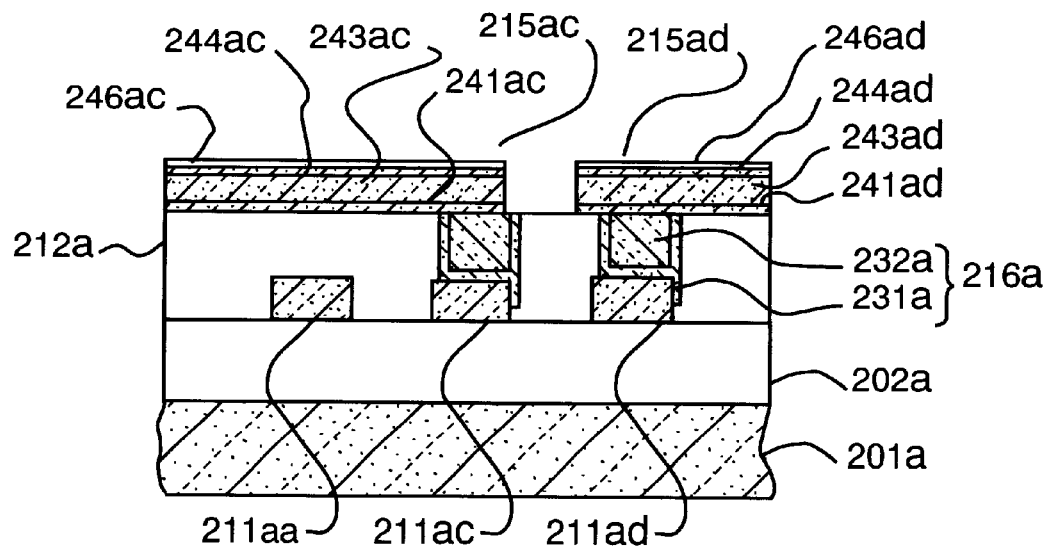
FIGS. 6A and 6B are cross sectional views taken through the lines A—A in FIGS. 5A and 5B, respectively.
Figure 6B:
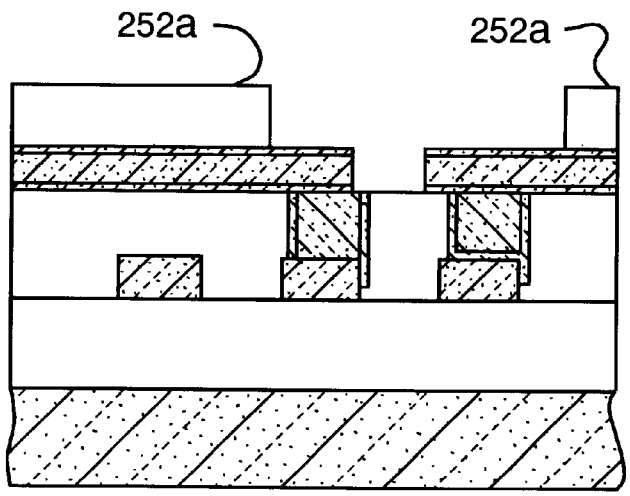

Referring to FIG. 5A, a field oxidation film of the LOCOS type extends over the surface of a silicon substrate 201a to form an insulating film 202a, whose thickness is around 0.4 im. Interconnects 211aa, 211ab, 211ac and 211ad of a lower level are formed on the surface of the silicon substrate 201a or the insulating film 202a on the silicon substrate 201a. The height from the surface of the silicon substrate 201a to the flat portion of the surface of the silicon substrate 201a is generally 0.2 im. The interconnects of the lower level excluding diffusion regions, if any, are 0.4 im thick. Silicon dioxide is formed over the entire surface of the assembly. The silicon dioxide is polished by chemical mechanical polishing (CMP) technique to provide a flat upper surface, thus providing an interlayer insulating film 212a. A difference between the upper surface of the interlayer insulating film 212a and the upper surface of the interconnect 211aa that is formed on the flat surface portion of the insulating film 202a, for example, of the lower level amounts to around 1.0 im. With photolithography using anisotropic etching, vias or contact holes 215aa, 215ab, 215ac and 215ad are etched through the interlayer insulating film 212a. The contact holes 215aa, 215ab, 215ac and 215ad are 0.4 im in diameter and extend to the interconnects 211aa, 211ab, 211ac and 211ad of the lower level, respectively. Let us consider the case where the lower level includes portions, such as diffusion regions formed on the silicon substrate 201a, which are different in height from that of the interconnect 211aa by at leas 0.4 im. In this case, another photolithography is preferably required to etch contact holes opening to the diffusion regions, respectively.

Subsequently, sputtering technique, which may preferably collimated sputtering wherein the sputtering beam is collimate, is used to deposit titanium nitride to the entire surface of the assembly including the contact holes to form a titanium nitride film. The titanium nitride film covers the exposed upper surfaces of the interconnects 211aa, 211ab, 211ac and 211ad to work as a barrier conductive film. To work as a barrier conductive film, the titanium nitride film should be about 50 nm thick at the exposed portions on the upper surfaces of the interconnects 211aa, for example, of the lower level by the contact holes 215aa, for example. If the lower level includes diffusion regions, it is preferred to deposit a nitride film as an underlying layer of the titanium nitride film. Subsequently, a tungsten film 132 of around 400 nm to 500 nm thick is deposited over the whole surface by a blanket chemical vapor deposition (CVD).

Subsequently, chemical mechanical polishing (CMP) technique is used to remove the tungsten film and titanium nitride film from the upper surface of the interlayer insulating film 212a, leaving tungsten film 232a and titanium nitride film 231a in each of the contact holes 215aa, 215ab, 215ac and 215ad to form a contact plug 216a. The upper end of each contact plug is flat and in flush with the upper surface of the interlayer insulating film 212a.

Sputtering technique is used to form a second titanium nitride file, as a second barrier conductive film, over the entire surface of the assembly to a thickness of 50 nm. Sputtering at a high temperature of 400° is carried out to form an aluminum alloy, containing copper, film over the entire surface of the second titanium film to a thickness of 400 nm. Sputtering technique is used to form a third titanium nitride film, as a third barrier conductive film, over the entire surface of the aluminum alloy film to a thickness 25 nm to 50 nm. Further, chemical vapor deposition (CVD) technique is used to form a silicon oxide film over the entire surface of the third titanium nitride film. As different from the example shown in FIGS. 1A to 3B, this example allows the use of the high temperature sputtering technique to form the aluminum alloy film because the aluminum alloy film is formed over the surface of the second titanium nitride. In the example shown in FIGS. 1A to 3A, the contact plugs are directly coated by aluminum film.

With a photoresist film (not shown) as a mask, anisotropic dry etching is used to etch the above-mentioned silicon oxide to form silicon oxide film caps 246aa, 246ab, 246ac and 246ad. Using this photoresist films as a mask and a mixture of Boron chloride ($BCl_3$) and chloride ($Cl_2$) as etching gas, anisotropic etching is used to etch the above-mentioned third titanium nitride film, aluminum alloy film, and second titanium nitride, forming titanium nitride film portions 244aa, 244ab, 244ac, and 244ad, aluminum alloy film portions 243aa, 243ab, 243ac and 243ad, and titanium nitride film portions 241aa, 241ab, 241ac and 241ad (see FIGS. 4A–4C, 5A and 6A).

In process of the anisotropic etching using a mixture of chloride gas an boron chloride gas, the titanium nitride film 216a, which defines a portion of each contact plug 216a and directly covers the side of the associated one of the contact holes 255aa, 255ab, 255ac and 255ad, to be etched badly due to micro loading effect has been etched little for reason which are not fully understood. However, it is believed by the inventor that deposition during the etching has suppressed etching of the titanium nitride film 216a.

It has been found that probability of etching the titanium nitride film 216a may be reduced to a satisfactorily low level by using the collimated sputtering to deposit the first titanium nitride film. This probability may be reduced more if a titanium tungsten film is used as the first barrier conductive film. If the titanium nitride film 321a is etched to some degree to form a clearance along the sidewall of one of the contact holes 215aa, 215ab, 215ac and 215ad, the clearance may be filled with aluminum due to the subsequent selective growing process of the aluminum film.

After the above-mentioned photoresist film has been stripped, a photoresist film 252a is formed, which has openings of 0.8 im, corresponding to the contact holes 215aa, 215ab, 215ac and 215ad. Such openings are independent, but may be connected if the associated contact holes are in the most contiguous relation (see FIGS. 5B and 6B).

Using the photoresist film 252a as a mask, selective low-pressure chemical vapor deposition (LPCVD) is performed to deposit aluminum film portions 247aa, 247ab, 247ac and 247ad over exposed sides of the patterned laminated conductive film structures, which are made up of titanium nitride film 241*aa*, 241*ab*, 241*ac* and 241*ad*, aluminum alloy film 244*aa*, 244*ab*, 244*ac* and 244*ad*, and also over the exposed portions of the upper ends of the contact plugs 216*a*. This LPCVD should be performed at substrate temperature of 100° C. to 150° C. because the photoresist film 252*a* is used as a mask.

Preferably, the LPCVD uses, as source gas, trimethylaluminium (Al (CH$_3$)$_3$) or dimethylaluminium hydride (Al H(CH$_3$)$_2$). After the photoresist film 252*a* has been stripped, the assembly is subject to heat treatment at around 450° C. (see FIGS. 4A to 4C).

This fabrication demands less degree of precision required for controlling processes to form the patterned laminated film of upper level than the fabrication shown in FIGS. 1A to 3B demands.

Figure 7A:
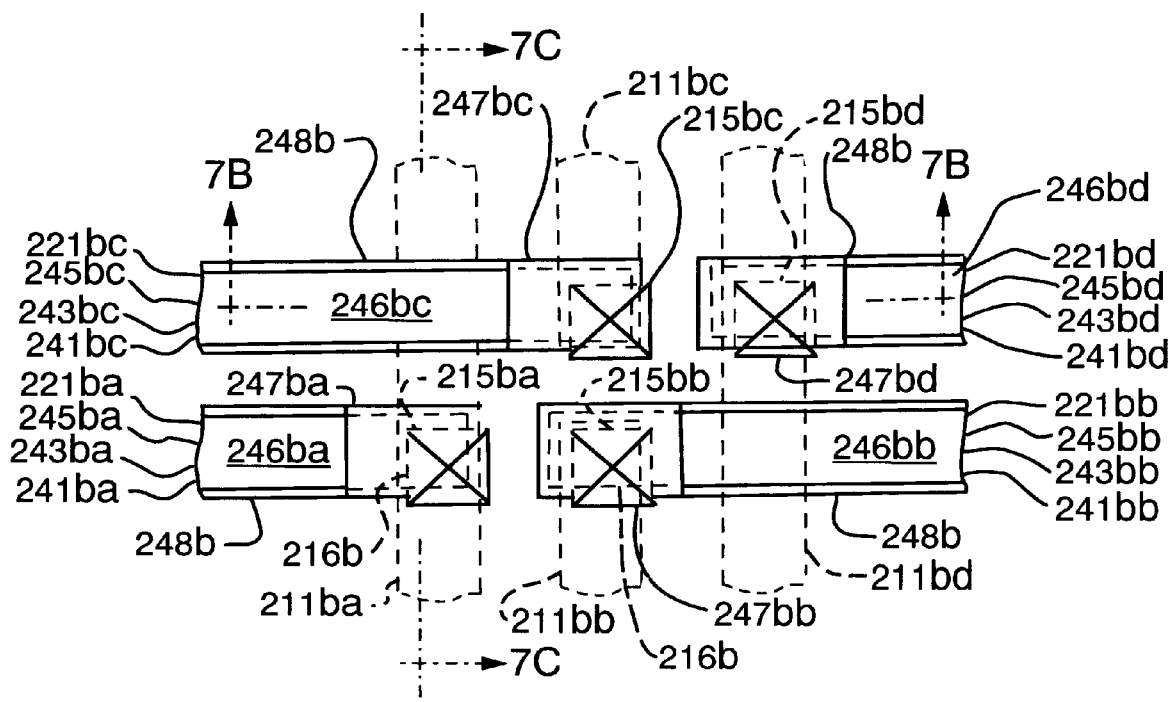
FIG. 7A is a plan view of a second embodiment of the second preferred implementation of a semiconductor device according to the invention.
Figure 7B:
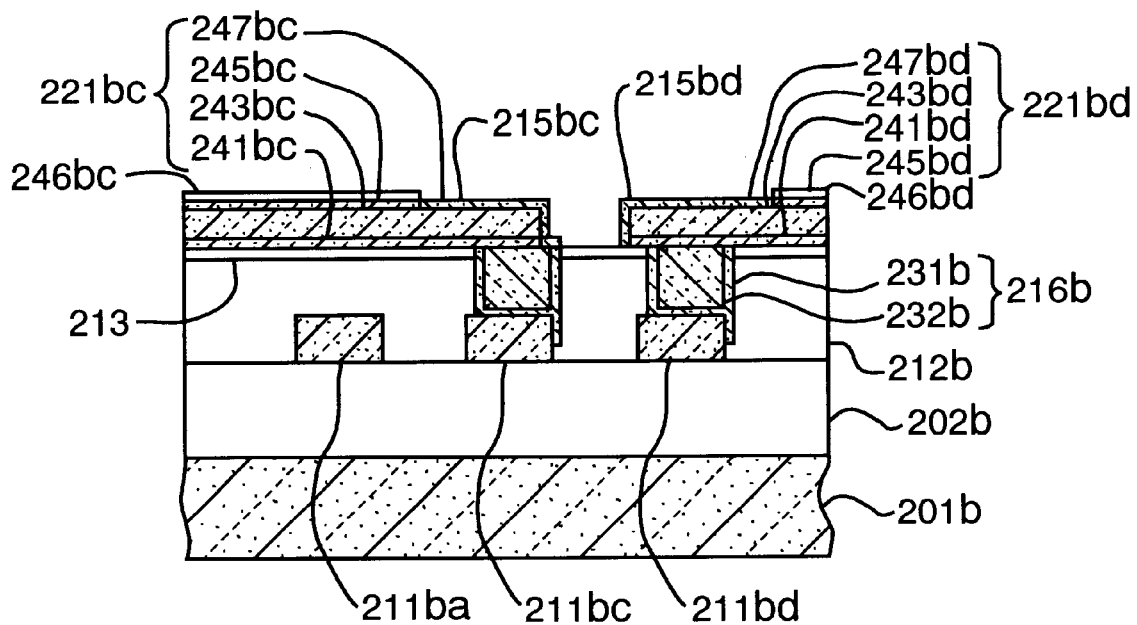
FIG. 7B is a cross sectional view taken through the line A—A in FIG. 7A.
Figure 7C:
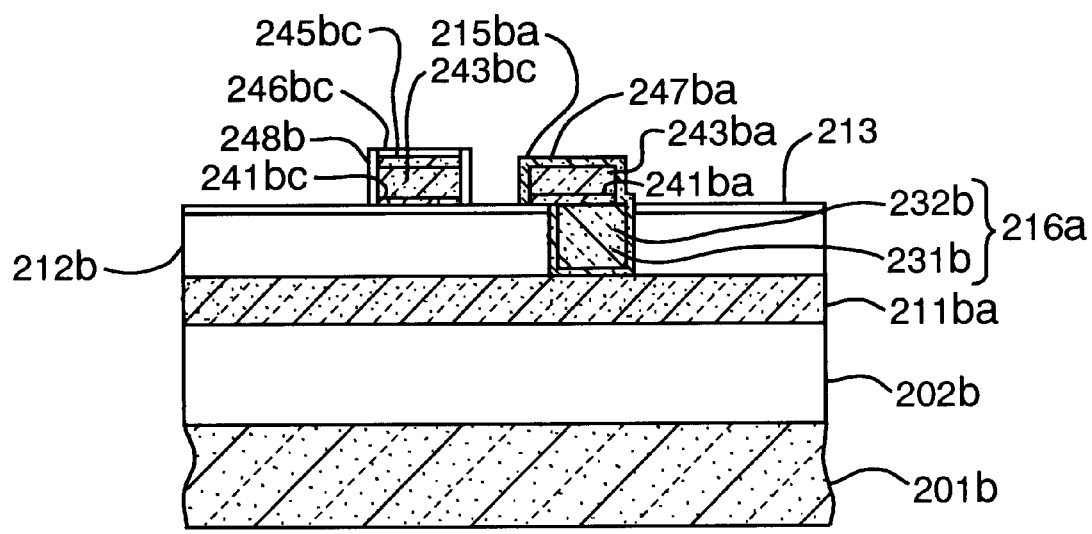
FIG. 7C is a cross sectional view taken through the line B—B in FIG. 7A.

FIGS. 7A to 7C illustrate the second embodiment of the second preferred implementation of the invention.

This embodiment is substantially the same as the first embodiment of the second preferred implementation. However, the former is different from the latter in that aluminum film portions 247*ba*, 247*bb*, 247*bc* and 247*bd* are used in the place of the third barrier conductive film in the form of titanium nitride film portions 244*aa*, 244*ab*, 244*ac* and 244*ad*. The aluminum film portions 247*ba*, 247*bb*, 247*bc* and 247*bd* define tops of the laminated films of an upper level.

Referring to FIGS. 7A–7C, a lower level, which includes interconnects 211*ba*, 211*bb*, 211*bc* and 211*bd*, is formed over the surface of a silicon substrate 201*b* via an insulating film 202*b*. The insulating film 202*b* may be formed of a field oxidation film of the LOCOS type. The field oxidation film is around 0.4 µm thick. The surface of the insulating film 202*b* may not necessarily be completely flat. The lower level is not limited to this example and may include a diffusion region, which constitutes a semiconductor element, on the surface of the silicon substrate 201*b*. The minimum width of each of the interconnects 211*ba*, 211*bb*, 211*bc* and 211*bd* is 0.4 im, the minimum line pitch is 0.8 im. The film thickness of the interconnects if the lower level does not include the diffusion region is around 0.4 im An interlayer insulation film 212*b* of silicon dioxide coats the surface of the insulating film 202*b* and the lower level interconnects 211*ba*, 211*bb*, 211*bc* and 211*bd*. The surface of the interlayer insulating film 212*b* is flat. For example, the thickness of the interlayer insulating film over the interconnect 211*aa* is 0.95 im. A silicon nitride film 213 of 250 nm thick directly coats the surface of the interlayer insulating film 212*b*. The laminated structure of the silicon nitride film 213 and the interlayer insulating film 202*b* is provided with contact holes 215*ba*, 215*bb*, 215*bc*, and 215*bd* over areas of the interconnect 211*ba*, 211*bb*, 211*bc* and 211*bd* where contacts are to be formed. The contact holes 215*ba*, 215*bb*, 215*bc* and 215*bd* are formed in the silicon nitride film 213 and interlayer insulating film 212*b* down to the interconnects 211*ba*, 211*bb*, 211*bc* and 211*bd*, respectively. The diameter of each of the contact holes is 0.4 im. The distance between the nearest two contact holes is 0.4 im. The minimum layout pitch of the contact holes amounts to 0.8 im. The width of clearance that is defined by side wall of the interconnect 211*ba*, for example, and side wall of the contact hole 215*ba* is less than the alignment margin and amounts at most to 0.5 im or 50 nanometers (nm).

Contact plugs 216*b* fill in the contact holes 215*ba*, 215*bb*, 215*bc* and 215*bd*, respectively. The upper ends of the contact plugs 216*b* are generally in flush with the surface of the silicon nitride film 213. Each of the contact plugs 216*b* is a laminated structure of a first barrier conductive film, which is in the form of a titanium nitride film 231*b*, and a tungsten film 231*b*. If the lower level includes diffusion region, a laminated film including a titanium film and a titanium nitride film is used. The thickness of the titanium nitride 211*ba*, 211*bb*, 211*bc* and 211*bd* is preferably at least around 50 nm so that it can work as a barrier conductive film. The thickness of the titanium nitride film 231*b* at the portion directly coating the side of each of the contact holes 215*ba*, 215*bb*, 215*bc* and 215*bd* is at most one several of the thickness of the titanium nitride film at a portion extending over the top of each of the lower level interconnects 211*ba*, 211*bb*, 211*bc* and 211*bd*. In this second embodiment, it is not preferable to use a titanium tungsten film as the first barrier conductive film.

Titanium nitride film portions 241*ba*, 241*bb*, 241*bc* and 241*bd*, each of which is around 50 nm thick and works as a second barrier conductive film, are in direct contact with the upper ends of the contact plugs 216*a* within the contact holes 215*ba*, 215*bb*, 215*bc* and 215*bd*. Each of the titanium nitride film portions 241*ba*, 241*bb*, 241*bc* and 241*bd* has extension directly coating the surface of the silicon nitride film 213. The minimum width of each of the silicon nitride film portions 241*ba*, 241*bb*, 241*bc* and 241*bd* is 0.4 im. The minimum distance between the adjacent two of the titanium nitride film portions 241*ba*, 241*bb*, 241*bc* and 241*bd* is 0.4 im. As the second barrier conductive film, a titanium film or a titanium nitride film or a laminated structure of a titanium film is preferred. A titanium tungsten film is not preferred as the second barrier conductive film. Aluminum alloy film portions 243*ba*, 243*bb*, 243*bc* and 241*bd* directly coat the upper surface of the titanium nitride film portions 241*ba*, 241*bb*, 241*bc* and 241*bd*, respectively. The aluminum alloy film portions 243*ba*, 243*bb*, 243*bc* and 243*bd*, each of which is 0.4 im thick and contains 0.5 wt % of copper, are of the same profile with the titanium nitride film portions 241*ba*, 241*bb*, 241*bc* and 241*bd*, respectively.

Titanium tungsten film portions 245*ba*, 245*bb*, 245*bc*, 245*bd* directly coat upper surfaces of the aluminum alloy film portions 243*ba*, 243*bb*, 243*bc*, and 243*bd*, leaving portions extending right above the contact holes 215*ba*, 215*bb*, 215*bc*, and 215*bd* and beyond as far as 0.2 µm uncovered. The thickness of each of the titanium tungsten ranges from 25 nm to 50 nm to work as a third barrier conductive film. Silicon oxide film caps 246*ba*, 246*bb*, 246*bc*, and 246*bd* directly coat the upper surfaces of the titanium tungsten film portions 245*ba*, 245*bb*, 245*bc*, and 245*bd*, respectively. A silicon oxide film spacer 248*b* directly coats sides of a laminated film structure that includes the silicon oxide film cap 246*ba*, titanium tungsten film portion 245*ba*, aluminum alloy film portion 243*ba* and titanium nitride film portion 241*ba*. The silicon oxide film spacer 248*b* directly coats sides of a laminated film structure that includes the silicon oxide film cap 246*bb*, titanium tungsten film portion 245*bb*, aluminum alloy film portion 243*bb* and titanium nitride film portion 241*bb*. The silicon oxide film spacer 248*b* directly coats sides of a laminated film structure that includes the silicon oxide film cap 246*bd*, titanium tungsten film portion 245*bd*, aluminum alloy film portion 243*bd* and titanium nitride film portion 241*bc*. The silicon oxide film spacer 248*b* directly coats sides of a laminated film structure that includes the silicon oxide film cap 246*bd*, titanium tungsten film portion 245*bd*, aluminum alloy film portion 243*bd* and titanium nitride film portin 241*bd*. The thickness of the silicon oxide film spacer 248*b* is around 50 nm. In this second embodiment of the second preferred implementation of the invention, the third barrier conductive film should preferably the titanium tungsten film.

The laminated conductive film structure including aluminum alloy film 243*ba* or 243*bb* or 243*bc* or 243*bd* and titanium nitride film 241*ba* or 241*bb* or 241*bc* or 241*bd* does not necessarily cover the upper end of the corresponding one contact plug 216*ba* or 216*bb* or 216*bc* or 216*bd*. This drives from alignment error in photolithography. The maximum width (corresponding to alignment margin) of the exposed portion of the contact plug 216*ba* or 216*bb* or 216*bc* or 216*bd* is around 50 nm.

An aluminum film portion 247*ba* directly coats the uncovered portion of the upper and side surfaces of the patterned laminated conductive film structure, which includes aluminum alloy film portion 243*ba* and titanium nitride film portion 241*ba*, and the uncovered portion of the upper end of the contact plug 216*b*. This contact plug 216*b* is disposed in 247*ba* ranges form 50 nm to 100 nm. The upper level 221*ba* includes aluminum film portion 247*ba*, titanium tungsten film portion 245*ba*, aluminum alloy film portion 243*ba*, and titanium nitride film portion 241*ba*. An aluminum film portion 247*bb* directly coats the uncovered portion of the upper and side surfaces of the patterned laminated conductive film structure, which includes aluminum alloy film portion 243*bb* and titanium nitride film portion 241*bb*, and the uncovered portion of the upper end of the contact plug 216*b*. This contact plug 216*b* is disposed in the contact hole 215*bb*. The thickness of the aluminum film 247*bb* ranges from 50 nm to 100 nm. The upper level wiring 221*bb* includes aluminum film portion 247*bb*, titanium tungsten film portion 245*bb*, aluminum alloy film portion 243*bb* and titanium nitride film portion 241*bb*. An aluminum film portion 247*bc* directly coats the uncovered portion of the upper and side surfaces of the patterned laminated conductive film structure, which includes aluminum alloy film portion 243*bc* and titanium nitride film portion 241*bc*, and the uncovered portion of the upper end of the contact plug 216*b*. This contact plug 216*b* is disposed in the contact hole 215*bc*. The thickness of the aluminum film 247*bc* ranges from 50 nm to 100 nm. The upper level interconnect 221*bc* includes aluminum film portion 247*bc*, titanium tungsten film portion 245*bc*, aluminum alloy film portion 243*bc*, and titanium nitride film portion 241*bc*. An aluminum film portion 247*bd* directly coats the uncovered portion of the upper and side surfaces of the patterned laminated conductive film structure, which includes aluminum alloy film portion 243*bd* and titanium nitride film portion 241*bd*, and the uncovered portion of the upper end of the contact plug 216*b*. This contact plug 216*b* is disposed in the contact hole 215*bd*. The thickness of the aluminum film 247*bd* ranges from 50 nm to 100 nm. The upper level interconnect 221*bd* includes aluminum film portion 247*bd*, titanium tungsten film portion 245*bd*, aluminum alloy film portion 243*bd* and titanium nitride film portion 241*bd*.

In this second embodiment of the second implementation, the aluminum film portion 247*ba*, 247*bb*, 247*bc* and 247*bd* perform the same function as the aluminum film portions 247*aa*, 247*ab*, 247*ac* and 247*ad* of the first embodiment of the second implementation.

Figure 8A:
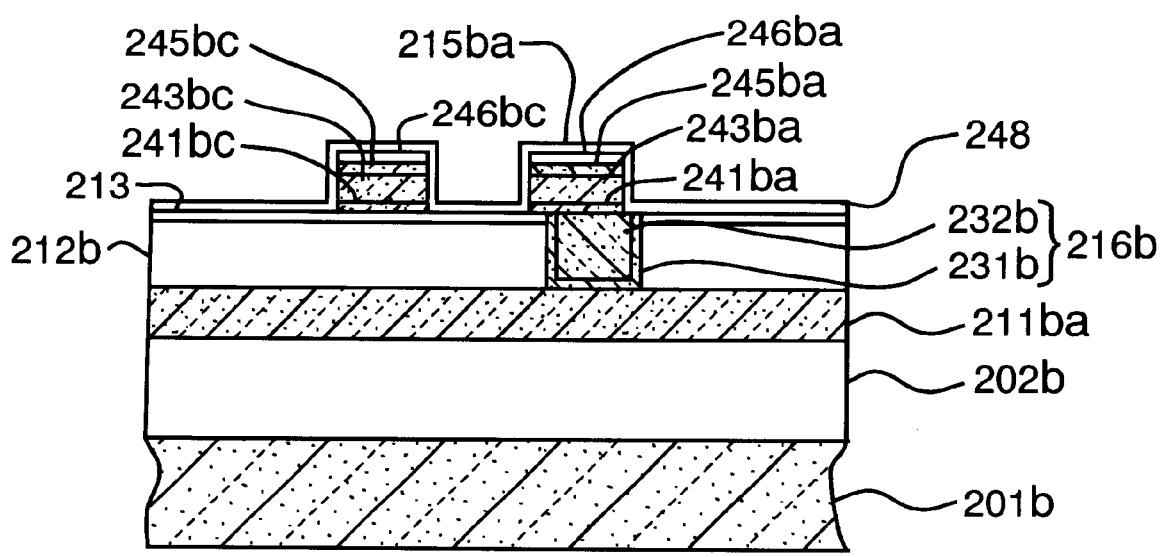
FIGS. 8A and 8B are cross sectional views taken through the B—B in FIG. 7A, illustrating fabrication steps of the semiconductor device shown in FIGS. 7A to 7C.
Figure 8B:
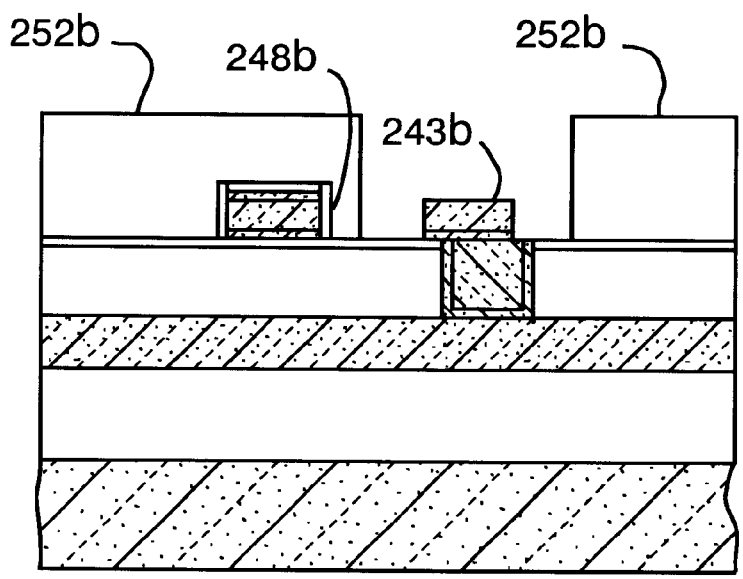

Referring also to FIGS. 8A & 8B, fabrication processes of the structure shown in FIGS. 7A to 7C is described.

Referring to FIG. 7A, a field oxidation film of the LOCOS type extends over the surface of a silicon substrate 201*b* to form an insulating film 202*b*, whose thickness is around 0.4 $\mu$m. Interconnects 211*ba*, 211*bb*, 211*bc* and 211*bd* of a lower level are formed on the surface of the silicon substrate 201*b*. The interconnects of the lower level excluding diffusion regions, if any, are 0.4 im thick. Silicon oxide film is formed over the entire surface of the assembly. The silicon oxide film is polished by chemical mechanical polishing (CMP) technique to provide a flat upper surface, thus providing an interlayer insulating film 212*b*. A difference between the upper surface of the interlayer insulating film 212*b* and the upper surface of the interconnect 211*ba* that is formed on the flat surface portion of the insulating film 202*b*, for example, of the lower level amounts to around 0.95 $\mu$m. CVD technique is used to form a silicon nitride film 213 over the upper surface of the interlayer insulating film 212*b*. The thickness of the silicon nitride film 213 is around 50 nm. With photolithography using anisotropic etching, vias or contact holes 215*ba*, 215*bb*, 215*bc* and 215*bd* are etched through the laminated insulating structure of the silicon nitride film 213 and the interlayer insulating film 212*b*. The contact holes 215*ba*, 215*bb*, and 215*bd* are 0.4 im in diameter and extend to the interconnects 211*ba*, 211*bb*, 211*bc* and 211*bd* of the lower level, respectively. Let us consider the case where the lower level includes portions, such as diffusion regions formed on the silicon substrate 201*b*, which are different in height from that of the interconnect 211*ba* by at least 0.4 im. In this case, another photolithography is preferably required to etch contact holes opening to the diffusion regions, respectively.

Subsequently, sputtering technique, which may preferably collimated sputtering, is used to deposit titanium nitride over the entire surface of the assembly including the contact holes 215*ba*, 215*bb*, 215*bc* and 215*bd* to form a titanium nitride film. The titanium nitride film should cover the exposed upper surfaces of the interconnects 211*aa*, 211*ab*, 211*ac* and 211*ad* to a thickness of around 50 nm to work as a barrier conductive film. If the lower level includes diffusion regions, it is preferred to deposit a titanium film as an underlying layer of the titanium nitride film. Subsequently, a tungsten film of around 400 nm to 500 nm thick is deposited over the whole surface by a blanket chemical vapor deposition (CVD).

Subsequently, chemical mechanical polishing (CMP) technique is used to remove the tungsten film and titanium nitride film from the upper surface of the silicon nitride film 213, leaving tungsten film 232*b* and titanium nitride film 231*b* in each of the contact holes 215*ba*, 215*bb*, 215*bc* and 215*bd* to form a contact plug 216*b*. The upper end of each contact plug 216*b* is flat and in generally flush with the upper surface of the silicon nitride film 213.

Sputtering technique is used to form a second titanium nitride film which works as a second barrier conductive film, over the entire surface of the assembly to a thickness of 50 nm. Sputtering at a high temperature of around 400° is carried out to form an aluminum alloy film, containing copper, over the entire surface of the second titanium film to a thickness of 400 nm. Sputtering technique is used to form a third titanium nitride film, as a third barrier conductive film, over the entire surface of the aluminum alloy film to a thickness 25 nm to 50 nm. Further, chemical vapor deposition (CVD) technique is used to form a silicon oxide film over the entire surface of the third titanium nitride film. As different from the example shown in FIGS. 1A to 3B, this example allows the use of the high temperature sputtering technique to form the aluminum alloy film because, without the provision of aluminum film directly coating the contact plugs, the aluminum alloy film is formed over the surface of the second titanium nitride.

With a photoresist film (not shown) as a mask and fluorinated etching gas, anisotropic dry etching is used to etch the above-mentioned silicon oxide film and titanium tungsten film to form silicon oxide film caps 246*ba*, 246*bb*, 246*bc* and 246*bd* and the titan tungsten film portions 245*ba*, 245*bb*, 245*bc* and 245*bd*. Using this photoresist film as a mask and a mixture gas of Boron chloride (BCl$_3$) and chloride (Cl$_2$) as etching gas, anisotropic etching is used to etch the above-mentioned aluminum alloy film and second titanium nitride film, forming aluminum alloy film portions 243*ba*, 243*bb*, 243*bc* and 243*bd*, and titanium nitride film portions 241*ba*, 241*bb*, 241*bc* and 241*bd*.

In process of the anisotropic etching using the mixture gas of chloride gas and boron chloride gas, the titanium nitride film 231*b*, which defines a portion of each contact plug 216*a* and directly covers the side of the associated one of the contact holes 215*ba*, 215*bb*, 215*bc* and 215*bd*, to be etched badly due to micro loading effect has been etched little. If the titanium nitride film 231*b* is etched to some degree to form a clearance along the sidewall of one of the contact holes 215*ba*, 215*bb*, 215*bc* and 215*bd*, the clearance may be filled with aluminum due to the subsequent selective growing process of the aluminum film.

After the above-mentioned photoresist film has been stripped, CVD technique, which is superior in covering stepped portions, is used to form a silicon oxide film 248 over the entire surface of the assembly to a thickness of 50 nm (see FIG. 8A). This silicon oxide film 248 is etched back to form a silicon oxide film spacer 248*b*.

A photoresist film 252*b* is formed, which has openings of 0.8 im, corresponding to the contact holes 215*ba*, 215*bb*, 215*bc* and 215*bd*. Such openings are independent, but may be connected if the associated contact holes are in the most contiguous relation. Using the photoresist film 252*b* as a mask, wet etching by buffer hydrofluoric acid is carried out to remove portions of the silicon oxide film spacer 248*b*, silicon oxide film caps 246*ba*, 246*bb*, 246*bc* and 246*bd*, and portions of titanium tungsten film portions 245*ba*, 245*bb*, 245*bc* and 245*bd* (see FIGS. 7B and 8B). In the process of this wet etching, the interlayer film 212*b* is not etched because the silicon nitride film 213 costs the upper surface of the interlayer insulating film 212*b*. The first and second barrier conductive films are not etched either because each is made of titanium nitride film. Thus, the titanium nitride film 231*b* and the titanium nitride film portions 241*ba*, 241*bb*, 241*bc* and 241*bd* are not etched.

After the photoresist film 252*b* has been stripped, selective low-pressure chemical vapor deposition (LPCVD) is performed to deposit aluminum film portions 247*ba*, 247*bb*, 247*bc* and 247*bd* over exposed sides of the patterned laminated conductive film structures, which are made up of aluminum alloy film portions 243*ba*, 243*bb*, 243*bc* and 243*bd*, and titanium nitride film portions 241*ba*, 241*bb*, 241*bc* and 241*bd*, and also over the exposed portions of the upper ends of the contact plugs 216*a*. This LPCVD can be performed at substrate temperature of 250° C., which is higher than the substrate temperature at which the LPCVD was performed in the first embodiment of the second preferred implementation. After the photoresist film used for the LPCVD has been stripped, the assembly is subject to heat treatment at around 450° C.

In the first and second preferred implementations of the invention, selective grown aluminum film has been employed. The present invention is not limited to these implementations. According to a third preferred implementation of the invention, the interlayer insulating film is recessed from the surface thereof at portions overlapping portions where contact holes are to be formed.

Figure 9A:
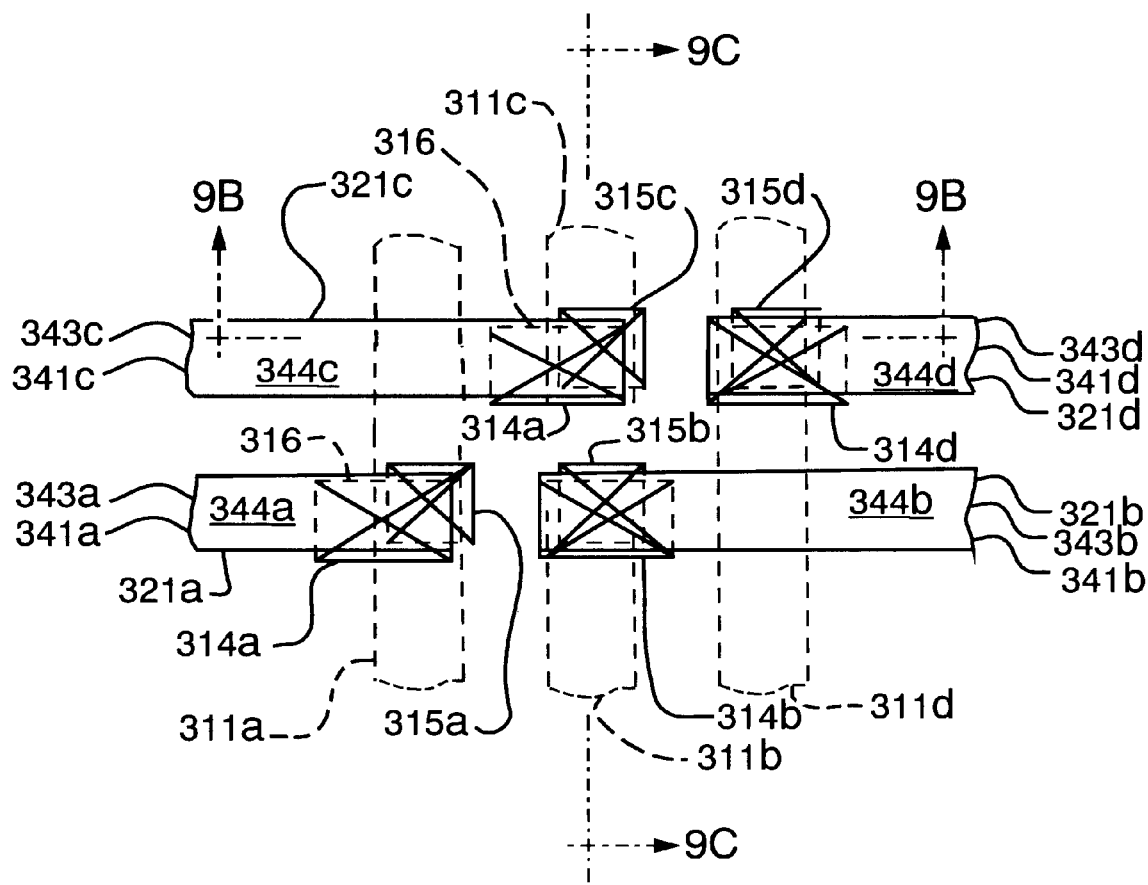
FIG. 9A is a plan view of a third preferred implementation of a semiconductor device according to the invention.
Figure 9B:
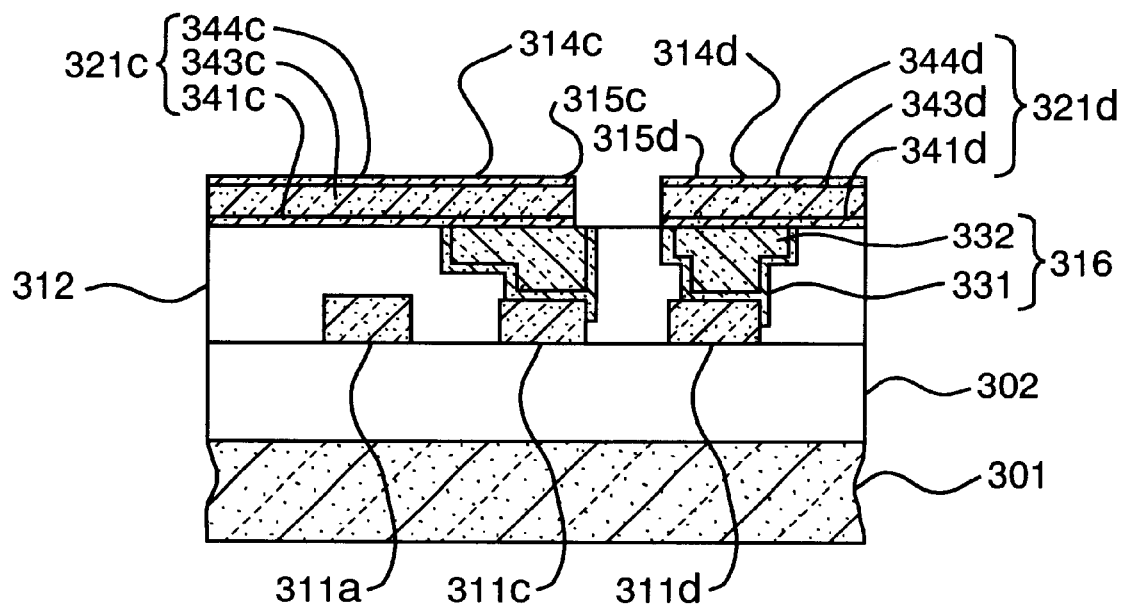
FIG. 9B is a cross sectional view taken through the line A—A in FIG. 9A.
Figure 9C:
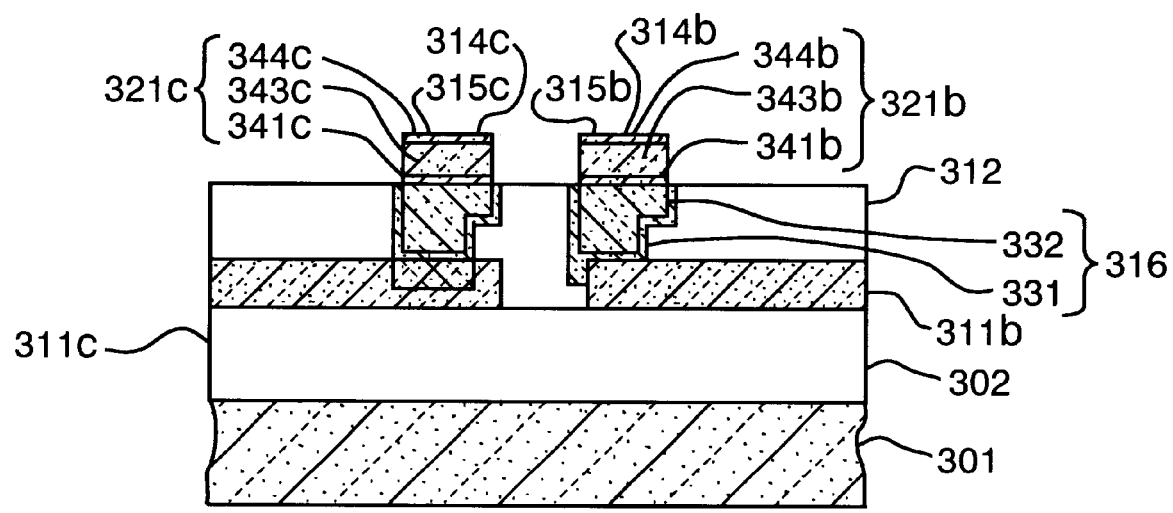
FIG. 9C is a cross sectional view taken through the line B—B in FIG. 9A.
Figure 10A:
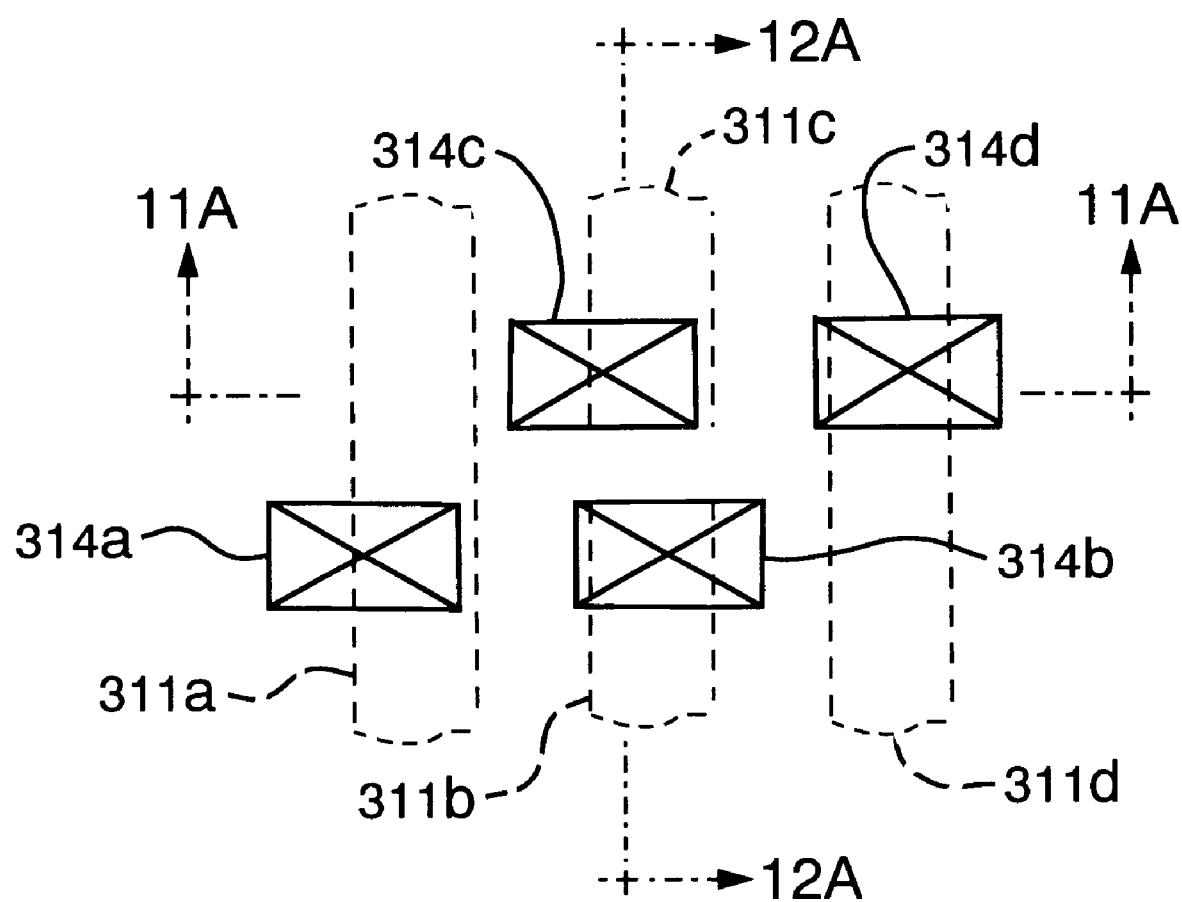
FIGS. 10A to 10C are plan views, illustrating fabrication steps of the semiconductor device shown in FIGS. 9A to 9C.
Figure 10B:
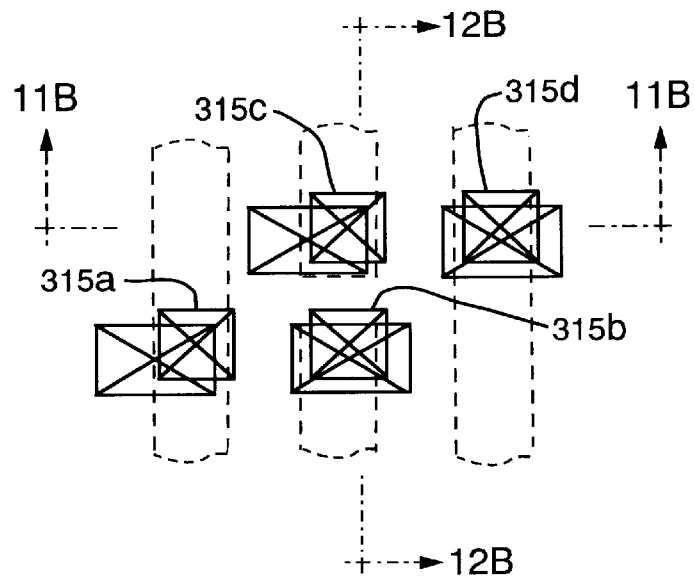
Figure 10C:
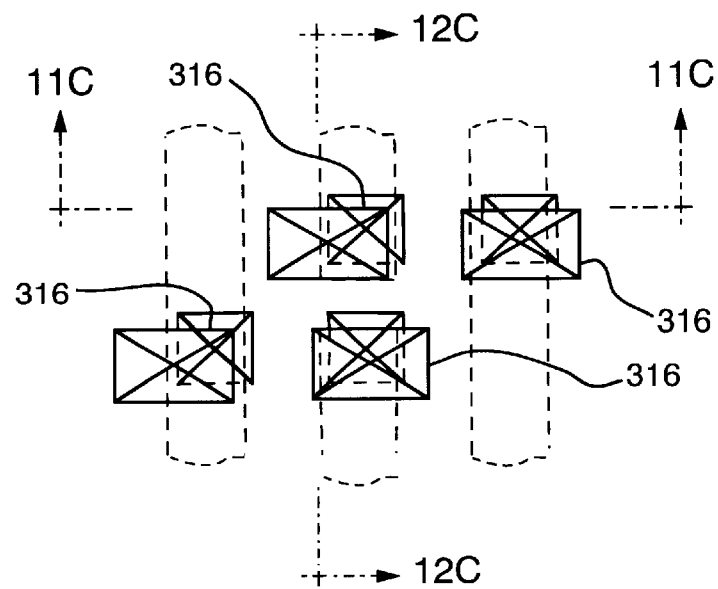
Figure 11A:
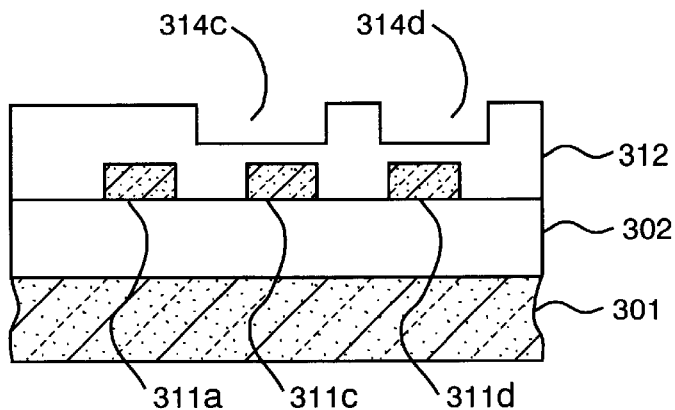
FIGS. 11A to 11C are cross sectional views taken through the lines A—A in FIGS. 10A to 10C, respectively, illustrating the fabrication steps.
Figure 11B:
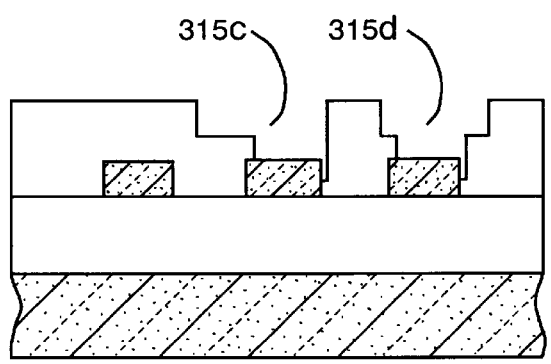
Figure 11C:
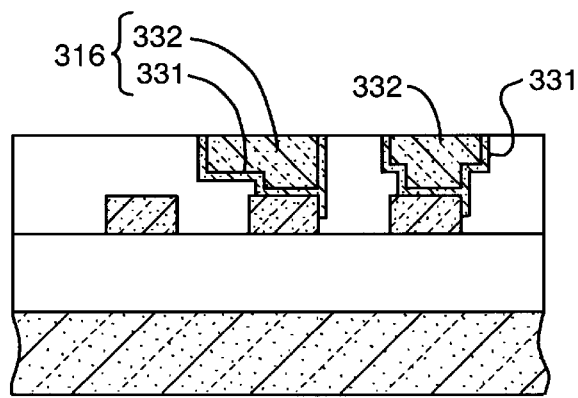
Figure 12A:
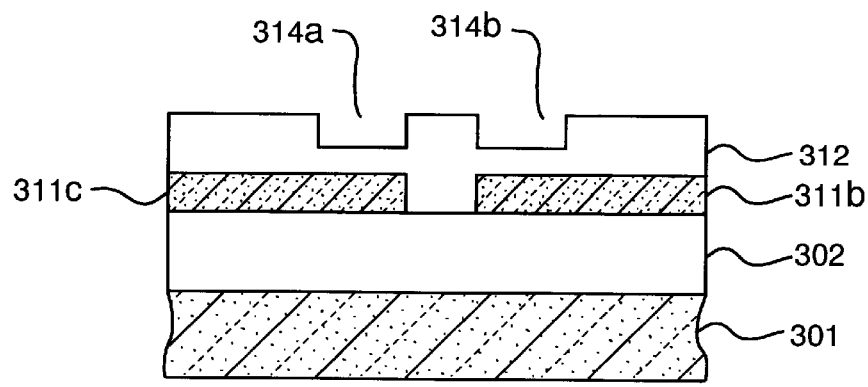
FIGS. 12A to 12C are cross sectional views taken through the lines B—B in FIGS. 10A to 10C, respectively, illustrating the fabrication steps.
Figure 12B:
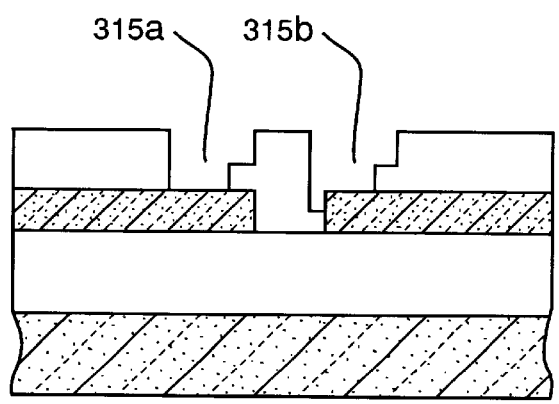
Figure 12C:
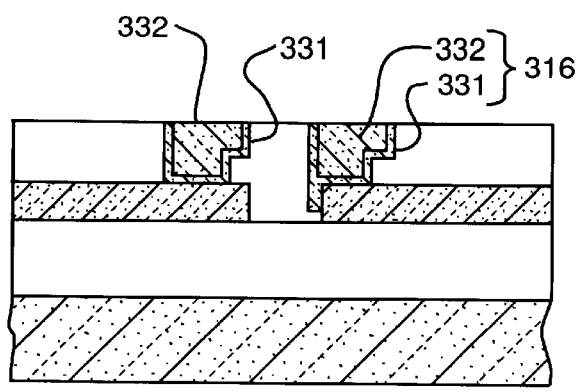

Referring to FIGS. 9A–9C, a lower level, which includes interconnects 311*a*, 311*b*, 311*c* and 311*d*, is formed over the surface of a silicon substrate 301 via an insulating film 302. The insulating film 302 may be formed of a field oxidation film of the LOCOS type. The field oxidation film is around 0.4 $\mu$m thick. The surface of the insulating film 302 may not necessarily be completely flat. The lower level is not limited to this example and may include a diffusion region, which constitutes a semiconductor element, on the surface of the silicon substrate 301. The minimum width of each of the interconnects 311*a*, 311*b*, 311*c* and 311*d* is 0.4 im, the minimum line pitch is 0.8 im. The film thickness of the interconnects if the lower level does not include the diffusion region is around 0.4 im.

An interlaying insulating film 312 of silicon oxide coats the surface of the insulating film 302 and the lower level interconnects 311*a*, 311*b*, 311*c* and 311*d*. The surface of the interlayer insulating film 312 is flat. For example, the thickness of the interlayer insulating film over the interconnect 311*a* is 1.0 im. The interlayer insulating film 312 is provided with contact holes 315*a*, 315*b*, 315*c*, and 315*d* over areas of the interconnects 311*a*, 311*b*, 311*c* and 311*d* where contact plugs are to be formed. The contact holes 315*a*, 315*b*, 315*c*, 315*d* are formed in the interlayer insulating film 312 down to the interconnects 311*a*, 311*b*, 311*c* and 311*d*, respectively. The interlayer insulating film 312 is also provided with recesses 314*a*, 314*b*, 314*c* and 314*d*, which overlap the contact holes 315*a*, 315*b*, 315*c* and 315*d*, respectively. The recesses 314*a*, 314*b*, 314*c* and 314*d* extend along interconnects of the upper level to be connected to the contacts plugs in the contact holes 315*a*, 315*b*, 315*c* and 315*d* in their longitudinal directions, respectively. The length of each of the recesses 314*a*, 314*b*, 314*c* and 314*d* along the longitudinal direction of the associated interconnect of the upper level is 0.6 im, the width thereof extending across the longitudinal direction of the associated interconnect is 0.4 im, and the depth thereof is 0.2 im. The contact holes 315*a*, 315*b*, 315*c* and 315*d* extend through the bottoms of the associated recesses 314*a*, 314*b*, 314*c* and 314*d*, respectively. The diameter of each of the contact holes is 0.4 im. The distance between the nearest two contact holes is 0.4 im. The width of clearance that is defined by side wall of the interconnect 311 a, for example, and side wall of the contact hale 315*a* is less than the alignment margin and amounts at most to 0.05 im or 50 nanometers (nm).

Contact plugs 316 fill in the recess 314*a* and its associated contact hole 315*a*, the recess 314*b* and its associated contact hole 315*b*, the recess 314*c* and its associated contact hole 315*c*, the recess 314*d* and its associated contact hole 315*d*, respectively. The upper ends of the contact plugs 316 are generally in flush with the surface of the interlayer insulating film 312. Each of the contact plugs 316 is a laminated film structure of a first barrier conductive film, which is in the form of a titanium nitride film 331, and a tungsten film 332. The first barrier conductive film is not limited to the titanium nitride film and may be titanium tungsten film. If the lower level includes diffusion region, a laminated film structure including a titanium film and a titanium nitride film is used. The thickness of the titanium nitride film 331 beneath the bottom of each of the recesses 314*a*, 314*b*, 314*c* and 314*d* and the thickness thereof over the top of each of the lower level interconnects 311*a*, 311*b*, 311*c* and 311*d* are preferably at least around 50 nm so that it can work as a barrier conductive film. The thickness of the titanium nitride film 331 at the portion directly coating the side of each of the contact holes 315*a*, 315*b*, 315*c* and 315*d* is at most one several of thickness of the titanium nitride film at a portion extending over the top of each of the lower level interconnects 311*a*, 311*b*, 311*c* and 311*d*.

Titanium nitride film portions 341*a*, 341*b*, 341*c* and 341*d*, each of which is around 50 nm thick and works as a second barrier conductive film, are in direct contact with the upper ends of the contact plug 316 within the recess 314a and the contact hole 315a, the contact plug 316 within the recess 314b and the contact hole 315b, the contact plug 316 within the recess 314c and the contact hole 315c, and the contact plug 316 within the recess 314d and the contact hole 315d. Each of the titanium nitride film portions 341a, 341b, 241c and 341d has extension directly coating the surface of the interlayer insulating film 312. The minimum width of each of the titanium nitride film portions 341a, 341b, 341c and 341d is 0.4 im. The minimum distance between the adjacent two of the titanium nitride film portions 341a, 341b, 341c and 341d is 0.4 im. The second barrier conductive film is not limited to the titanium nitride film and may be titanium film or laminated film structure of titanium film and titanium nitride film to titanium tungsten film. Aluminum alloy film portions 343a, 343b, 343c and 343d directly coat the upper surfaces of the titanium nitride film portions 341a, 341b, 341c and 341d, respectively. The aluminum alloy film portions 343a, 343b, 343c and 343d, each of which is 0.4 im thick and contains 0.5 wt % of copper, are of the same profile with the titanium nitride film portions 341a, 341b, 341c and 341d, respectively.

Titanium nitride film portions 344a, 344b, 344c, and 344d, each of which is 25 nm to 50 nm thick and works as a third barrier conductive film portions, directly cost upper surfaces of the aluminum alloy film portions 343a, 343b, 343c, and 343d. An upper layer interconnect 321a, which is connected via the recess 314a and the contact hole 315a with the lower layer interconnect 311a, is composed of aluminum alloy film portion 343a and titanium nitride film portion 344a. An upper layer interconnect 321b, which is connected via the recess 314b and the contact hole 315b with the lower level interconnect 311b, is composed of aluminum alloy film portion 343b and titanium nitride film portion 344b. An upper level interconnect 321c, which is connected via the recess 314c and the contact hole 315c with the lower level interconnect 311c, is composed of aluminum alloy film portion 343c and titanium nitride film portion 344c. An upper level interconnect 321d, which is connected via the recess 314d and the contact hole 315d with the lower level interconnect 311d, is composed of aluminum alloy film portion 343d and titanium nitride film portion 344d.

Each of the upper layer interconnects 321a, 321b, 321c and 321d does not necessarily coat completely the upper end of the underlying contact plug 316 disposed within the recess 314a or 314b or 314c or 314d and the contact hole 315a or 315b or 315c or 315d. This derives from an alignment error in photolithography. The maximum width (alignment margin) of the exposed portion of each of the contact plugs 316 uncovered by the laminated conductive film structure is around 50 nm. Taking into account the maximum width of the exposed portion of the contact plug 316, the minimum contact area between the upper level interconnect and the underlying contact plug 316 can be expressed as $(0.6-0.05)im \times (0.4-0.05)im = 0.1925\ im^2$. This minimum contact area is still greater than $(0.4\ im)^2$. The third implementation of the invention, therefore, provides the same effect as that provided by the first and second implementations of the invention.

Referring also to FIGS. 10A to 10C, 11A to 11C, and 12A to 12C, fabrication processes of the structure shown in FIGS. 9A to 9C is described.

A field oxidation film of the LOCOS type extends over the surface of a silicon substrate 301 to form an insulating film 302, whose thickness is around 0.4 $\mu$m. Interconnects 311a, 311b, 311c and 311d of a lower level are formed on the surface of the silicon substrate 301 or the insulating film 302 on the silicon substrate 301. The flat portion of the surface of insulating film 302 is around 0.2 im in height if the surface of the silicon substrate 301 is considered as the standard. The interconnects of the lower layer excluding diffusion regions, if any, are around 0.4 im thick. Silicon oxide film is formed over the entire surface of the assembly. The silicon oxide film is polished by chemical mechanical polishing (CMP) technique to provide a flat upper surface, thus providing an interlayer insulating film 312. A difference between the upper surface of the interlayer insulating film 312 and the upper surface of the wiring 311a that is formed on the flat surface portion of the insulating film 302, for example, of the lower level amounts to around 1.0 $\mu$m.

Photolithography technique using anisotropic etching is performed to form recesses 314a, 314b, 314c and 314d within the surface of the interlayer insulating film 312 as shown in FIGS. 9A–9C, 10A, 11A and 12A. The recesses 314a, 314b, 314c and 314d are formed within portions, which include portions where contact holes extending to the underlying interconnects 311a, 311b, 311c and 311d are to be formed. Each of the recesses has a length extending a longitudinal direction in which the associated upper level interconnect extends. The length is 0.6 im in this example. The width of each recess that across the longitudinal direction is 0.4 im and the depth thereof is around 0.2 im. The length of each recess is not limited to 0.6 im.

With photolithography using anisotropic etching, vias or contact holes 315a, 315b, 315c and 315d are etch through the interlayer insulating film 312. The contact holes 315a, 315b, 315c and 315d are 0.4 im in diameter and extend through portions of the bottoms of the recesses 314a, 314b, 314c and 314d to the underlying interconnects 311a, 311b, 311c and 311d of the lower level, respectively. Reference is made to FIGS. 9A–9C, 10B, 11B and 12b in this regard. Let us consider the case where the lower level includes wiring portions, such as diffusion regions formed on the silicon substrate 301, which are different in height from that of the wiring 311a by at least 0.4 im. In this case, another photolithography is preferably required to etch contact holes opening to the diffusion regions, respectively.

Subsequently, sputtering techniques, which may preferably collimated sputtering, is used to deposit titanium nitride over the entire surface of the assembly including the contact holes 315a, 315b, 315c and 315d to form a titanium nitride film. The titanium nitride film should cover the exposed upper surfaces of the lower layer interconnects 311a, 311b, 311c and 311d to a thickness of around 50 nm to work as a barrier conductive film for them. In this case, it also covers the bottoms of the recesses 314a, 314b, 314c and 314d to a thickness of around 50 nm. If the lower level includes diffusion regions, it is preferred to deposit a titanium film as an underlying layer of the titanium nitride film. Subsequently, a tungsten film of around 400 nm to 500 nm thick is deposited over the whole surface by a blanket chemical vapor deposition (CVD). Subsequently, chemical mechanical polishing (CMP) technique is used to completely remove the tungsten film and titanium nitride film from the upper surface of the interlayer insulating film 312, leaving tungsten film 332 and titanium nitride film 331 in each of the contact holes and the recesses 315a and 314a, 315b and 314b, 315c and 314c, and 315d and 314d to form a contact plug 316. The upper end of each contact plug 316 is flat and in generally flush with the upper surface of the interlayer insulating film 312 (see FIGS. 9A to 9C).

Sputtering technique is used to form a second titanium nitride film, which works as a second barrier conductive film, over the entire surface of the assembly to a thickness of 50 nm. Sputtering at a high temperature of around 400° is carried out to form an aluminum alloy film, containing copper, over the entire surface of the second titanium film to a thickness of 400 nm. Sputtering technique is used to form a third titanium nitride film, as a third barrier conductive film, over the entire surface of the aluminum alloy film to a thickness 25 nm to 50 nm.

Using a photoresist film (not shown) as a mask and a mixture of Boron chloride ($BCl_3$) and chloride ($Cl_2$) as etching gas, anisotropic etching is used to etch the above-mentioned third titanium nitride film, aluminum alloy film, and second titanium nitride, forming titanium nitride film portions 344a, 344b, 344c, and 344d, aluminum alloy film portions 343a, 343b, 343c and 343d, and titanium nitride film portions 341a, 341b, 341c and 341d, thus forming the upper layer interconnects 321a, 321b, 321c and 321d. After the photoresist film has been stripped, the assembly is subject to heat treatment at around 450° C.

The first preferred implementation of the invention suppresses a reduction in contact area between an upper level interconnect and a contact plug due to coverage of the upper end of the contact plug with selective grown aluminum film.

The second preferred implementation of the invention suppresses a reduction in contact area between an upper level interconnect and a contact plug disposed in a contact hole due to coverage of the upper level interconnect at least sides thereof extending over the contact hole and its neighborhood with selectively grown aluminum film.

The third preferred implementation of the invention suppresses a reduction in contact area between an upper level interconnect and a contact plug due to formation of a recess connected to a contact hole within an interlayer insulating film.

The first, second, and third implementations of the invention suppress an increase of coupling capacity between the adjacent two interconnects of the upper layer, a deterioration of EM resist property of the upper level, and an increase of electric power consumption.

While the present invention has been particularly described, in conjunction with the preferred implementations, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said upper flat surface portion and opening to said plurality of lower level interconnects;

a plurality of contact plugs, each filling one of said plurality of contact holes and directly connected with the associated one of said plurality of lower level interconnects at a bottom end portion thereof, each of said plurality of contact plugs including a tungsten film and a first barrier conductive film that has a predetermined thickness, said bottom end portion of each of said plurality of contact plugs being in direct contact with the associated one of said plurality of lower level interconnects and formed with said first barrier conductive film; and a plurality of upper level interconnects formed on said interlayer insulating film and connected with said plurality of lower level interconnects by said plurality of contact plugs, each of said plurality of upper level interconnects including aluminum film, said aluminum film being in direct contact with and covering an upper end of the associated one of said plurality of contact plugs, each of said plurality of upper level interconnects also including aluminum alloy film formed on said upper flat surface portion of said interlayer insulating film, said aluminum alloy film being in direct contact with said aluminum film at an area right above the upper end of the associated one of said plurality of contact plugs.

2. The semiconductor device as claimed in claim 1, wherein each of said plurality of contact holes has an aperture size that is determined by the minimum dimensions possible with current processing techniques, wherein each of said plurality of upper level interconnects has a predetermined thickness and a width that is determined by the minimum dimensions possible with current processing techniques, wherein the adjacent two of said plurality of upper level interconnects are spaced a distance that is determined by the minimum dimensions possible with current processing techniques.

3. The semiconductor device as claimed in claim 1, wherein said upper end of each of said plurality of contact plugs is generally in flush with said upper flat surface portion of said interlayer insulating film.

4. The semiconductor device as claimed in claim 1, wherein said first barrier conductive film is made of titanium nitride.

5. The semiconductor device as claimed in claim 3, wherein each of said plurality of upper level interconnects includes a second barrier conductive film with a second predetermined thickness, said second barrier conductive film being in direct contact with and covering an upper surface of said aluminum alloy film thereof.

6. The semiconductor device as claimed in claim 4, wherein said second barrier conductive film is made of a material selected from a group consisting of titanium nitride and titanium tungsten.

7. A semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said upper flat surface portion and opening to said plurality of lower level interconnects;

a plurality of contact plugs, each filling one of said plurality of contact holes and directly connected with the associated one of said plurality of lower level interconnects at a bottom end portion thereof, each of said plurality of contact plugs including a tungsten film and a first barrier conductive film that has a predetermined thickness, said bottom end portion of each of said plurality of contact plugs being in direct contact with the associated one of said plurality of lower level interconnects and formed with said first barrier conductive film; and a plurality of upper level interconnects formed on said interlayer insulating film and connected with said plurality of lower level interconnects by said plurality of contact plugs, each of said plurality of upper level interconnects including an aluminum alloy film extending over said upper flat surface portion of said interlayer insulating film and an aluminum film, said aluminum film being in direct contact with and covering sides of said aluminum alloy film at areas extending right above an upper end of the associated one of said plurality of contact plugs and in the neighborhood thereof.

8. The semiconductor device as claimed in claim 7, wherein each of said plurality of contact holes has an aperture size that is determined by the minimum dimensions possible with current processing techniques, wherein each of said plurality of upper level interconnects has a predetermined thickness and a width that is determined by the minimum dimensions possible with current processing techniques, wherein the adjacent two of said plurality of interconnects are spaced a distance that is determined by the minimum dimensions possible with current processing techniques.

9. The semiconductor device as claimed as claim 7, wherein each of said plurality of upper level interconnects includes a second barrier conductive film with a second predetermined thickness, said second barrier conductive film being disposed between said upper flat surface portion of said interlayer insulating film and a lower surface of said aluminum alloy film, said second barrier conductive film being in direct contact with the upper end of the associated one of said plurality of contact plugs;

wherein each of said upper level interconnects includes a third barrier conductive film having a third predetermined thickness, said third barrier conductive film directly covering an upper surface of said aluminum alloy film; and wherein said aluminum film directly covers sides of said second and third barrier conductive films at areas extending right above the upper end surface of the associated one of said plurality of contact plugs and in the neighborhood thereof.

10. The semiconductor device as claimed in claim 7, wherein said upper end of each of said plurality of contact plugs is generally in flush with said upper flat surface portion of said interlayer insulating film.

11. The semiconductor device as claimed in claim 7, wherein each of said plurality of upper level interconnects includes a second barrier conductive film with a second predetermined thickness, said second barrier conductive film being disposed between said upper flat surface portion of said interlayer insulating film and a lower surface of said aluminum alloy film, said second barrier conductive film being in direct contact with the upper end surface of the associated one of said plurality of contact plugs;

wherein each of said upper level interconnects includes a third barrier conductive film with a third predetermined thickness, said third barrier conductive film being in direct contact with and covering an upper surface of said aluminum alloy film at areas excluding areas, which extend right above the upper end surface of the associated one of said plurality of contact plugs and in the neighborhood thereof;

wherein said aluminum film are in direct contact with and covers sides of said second barrier conductive film at areas extending right above the upper end surface of the associated one of said plurality of contact plugs and in the neighborhood thereof; and wherein said aluminum film is in direct contact with and covers the upper surface of said aluminum alloy film.

12. The semiconductor device as claimed in claim 9, wherein the upper end of each of said plurality of contact plugs is generally in flush with said upper flat surface portion of said interlayer insulating film.

13. The semiconductor device as claimed in claim 9, wherein said first barrier conductive film is made of a material selected from a group consisting of titanium nitride and titanium tungsten.

14. The semiconductor device as claimed in claim 9, wherein said first barrier conductive film is made of a laminated structure of a titanium film and a titanium nitride film.

15. The semiconductor device as claimed in claim 9, wherein said second barrier conductive film is made of titanium nitride.

16. The semiconductor device as claimed in claim 9, wherein said third barrier conductive film is made of titanium nitride.

17. The semiconductor device as claimed in claim 11, wherein the upper end of each of said plurality of contact plugs is generally in flush with said upper flat surface portion of said interlayer insulating film.

18. The semiconductor device as claimed in claim 11, wherein said second barrier conductive film is made of a material selected from a group consisting of titanium and titanium nitride.

19. The semiconductor device as claimed in claim 11, wherein said second barrier conductive film is made of a laminated structure of a titanium film and a titanium nitride film.

20. The semiconductor device as claimed in claim 11, wherein said third barrier conductive film is made of titanium tungsten.

21. A semiconductor device comprising:

a substrate having a surface;

a plurality of lower level interconnects over or above said surface of said substrate;

an interlayer insulating film covering said plurality of lower level interconnects, said interlayer insulating film having an upper flat surface portion and a plurality of contact holes disposed in said flat surface portion and opening to said plurality of lower level interconnects;

a plurality of upper level interconnects formed on said interlayer insulating film and connected with said plurality of lower level interconnects via said plurality of contact holes, each of said upper level interconnects including an aluminum alloy film with a predetermined thickness;

said interlayer insulating film having a plurality of recesses, said plurality of recesses being recessed from said flat surface portion and communicating with said plurality of contact holes, respectively, each of said plurality of recesses being recessed from said flat surface portion and having an aperture occupying an area of said flat surface portion, which area is adapted to be covered by the associated one of said plurality of upper interconnects, said aperture of each of said plurality of recesses extending in a first direction, in which the associated one upper level interconnect runs, by a predetermined length and also in a second direction, which crosses said first direction, by a predetermined width, each of said plurality of recesses having a bottom spaced less from said flat surface portion than an upper surface of the associated one of said plurality of lower level interconnect;

a plurality of contact plugs, each filling one of said plurality of contact holes and one of said plurality of recesses which communicates therewith, each of said plurality of contact plugs being in direct contact with the associated one of said plurality of lower level interconnects at a bottom end portion thereof, each of said plurality of contact plugs including a tungsten film and a barrier conductive film with a predetermined thickness, said bottom end portion of each of said plurality of contact plugs being formed with said barrier conductive film, each of said plurality of contact plugs including a boundary portion in direct contact with said bottom of the associated one of said plurality of recesses, said boundary portion being formed with said barrier conductive film.

22. The semiconductor device as claimed in claim 21, wherein each of said plurality of contact holes has an aperture size that is determined by the minimum dimensions possible with current processing techniques, wherein each of said plurality of upper level interconnects has a predetermined thickness and a width that is determined by the minimum dimensions possible with current processing techniques, wherein the adjacent two of said plurality of upper level interconnects are spaced a distance that is determined by the minimum dimensions possible with current processing techniques, and wherein the length of each of said aperture of said plurality of recesses is longer than the minimum dimension possible with current processing technique and the width of each of said apertures of said plurality of recesses is determined by the minimum dimensions possible with current processing techniques.

23. The semiconductor device as claimed in claim 21, wherein each of said plurality of upper level interconnects includes a second barrier conductive film, having a second predetermined thickness, disposed between said interlayer insulating film and a lower surface of said aluminum alloy film thereof;

wherein said second barrier conductive film is in direct contact with an upper end of the associated one of said plurality of contact plugs; and wherein each of said plurality of upper level interconnects includes a third barrier conductive film, having a third predetermined thickness, in direct contact with and covering an upper surface of said aluminum alloy film thereof.

24. The semiconductor device as claimed in claim 21, wherein the upper end of each of said plurality of contact plugs is generally in flush with said upper flat surface portion of said interlayer insulating film.

25. The semiconductor device as claimed in claim 23, wherein the upper end of each of said plurality of contact plugs is generally in flush with said upper flat surface portion of said interlayer insulating film.

26. The semiconductor device as claimed in claim 23, wherein said first barrier conductive film is made of titanium nitride, wherein said second barrier conductive film is made of titanium nitride, and wherein said third barrier conductive film is made of titanium nitride.

* * * * *